(12) United States Patent
Kwon et al.

(10) Patent No.: US 8,415,225 B2
(45) Date of Patent: Apr. 9, 2013

(54) METHODS OF MANUFACTURING SEMICONDUCTOR DEVICES

(75) Inventors: Hyung-Shin Kwon, Hwaseong-Si (KR); Hyung-Dong Kim, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 30 days.

(21) Appl. No.: 13/221,099

(22) Filed: Aug. 30, 2011

(65) Prior Publication Data

US 2012/0052648 A1 Mar. 1, 2012

(30) Foreign Application Priority Data

Sep. 1, 2010 (KR) .................. 10-2010-0085237

(51) Int. Cl.
*H01L 21/02* (2006.01)
(52) U.S. Cl.
USPC ..... 438/381; 438/238; 438/393; 257/E21.011
(58) Field of Classification Search .................. 438/238, 438/250, 381, 393
See application file for complete search history.

(56) References Cited

U.S. PATENT DOCUMENTS

| | | | |
|---|---|---|---|
| 6,235,577 B1 * | 5/2001 | Jeon | 438/253 |
| 6,545,360 B1 * | 4/2003 | Ohkubo et al. | 257/758 |
| 2002/0163007 A1 * | 11/2002 | Matsumoto et al. | 257/94 |
| 2007/0273005 A1 * | 11/2007 | Hwang | 257/532 |
| 2008/0191254 A1 * | 8/2008 | Matsuura | 257/295 |
| 2010/0155889 A1 * | 6/2010 | Cho et al. | 257/532 |
| 2010/0240191 A1 * | 9/2010 | Chung et al. | 438/386 |
| 2011/0156181 A1 * | 6/2011 | Takeuchi et al. | 257/421 |
| 2012/0171840 A1 * | 7/2012 | Cho et al. | 438/396 |

FOREIGN PATENT DOCUMENTS

| | | |
|---|---|---|
| JP | 2005-123376 | 5/2005 |
| KR | 10-0688554 | 2/2007 |
| KR | 1020090107817 | 10/2009 |

* cited by examiner

*Primary Examiner* — Alexander Ghyka
(74) *Attorney, Agent, or Firm* — Harness, Dickey & Pierce, P.L.C.

(57) ABSTRACT

A semiconductor device may include lower electrodes having different heights depending on positions on a substrate. Supporting layer pattern making a contact with the lower electrodes having a relatively large height is provided. The supporting layer pattern is provided between the lower electrodes for supporting the lower electrodes. A dielectric layer is provided on the lower electrodes and the supporting layer pattern. An upper electrode is formed on the dielectric layer and has a planar upper surface. An inter-metal dielectric layer is provided on the upper electrode. A metal contact penetrating through the inter-metal dielectric layer and making a contact with the upper electrode is formed. A bottom portion of the metal contact faces a portion under where the lower electrode having a relatively small height is formed. The device has a higher reliability.

9 Claims, 22 Drawing Sheets

METHODS OF MANUFACTURING SEMICONDUCTOR DEVICES

CROSS-REFERENCE TO RELATED APPLICATION

This application claims priority under 35 USC §119 to Korean Patent Application No. 10-2010-0085237, filed on Sep. 1, 2010 in the Korean Intellectual Property Office (KIPO), the contents of which are herein incorporated by reference in their entirety.

BACKGROUND

1. Field

Example embodiments relate to semiconductor devices and methods of manufacturing the same. More particularly, example embodiments relate to semiconductor devices including a capacitor and methods of manufacturing the same.

2. Description of the Related Art

A DRAM is a memory device including a unit cell of a MOS transistor for selecting a cell and a capacitor. Data of the cell may be differentiated by the charge stored in the capacitor. In order to drive the memory device with a relatively low electric source and voltage, capacitors having a relatively high electric capacitance may be required in a peripheral region. Accordingly, capacitors having the same structure as the capacitors formed in the cell region may be partially fainted in the peripheral region. However, when capacitors having a relatively high electric capacitance are formed in the peripheral region, a bridge defect with upper metal contacts or a leakage current defect of the capacitor may be frequently generated.

SUMMARY

Various example embodiments relate to a semiconductor device having a reduced operational defect and a higher reliability.

Various example embodiments relate to a method of manufacturing the above-described semiconductor device.

According to example embodiments, a semiconductor device may include lower electrodes having different heights depending on their positions on a substrate. For instance, each of the lower electrodes may have a taller side with a height that is greater than an opposing shorter side. A supporting layer pattern may make contact with the lower electrodes having a relatively large height. The supporting layer pattern may be provided between the lower electrodes for supporting the lower electrodes. A dielectric layer may be provided on the lower electrodes and the supporting layer pattern. An upper electrode may be aimed on the dielectric layer and may have a planar upper surface. An inter-metal dielectric layer may be provided on the upper electrode. A metal contact penetrating through the inter-metal dielectric layer and making a contact with the upper electrode may be formed. A bottom portion of the metal contact may face a portion where the lower electrode having a relatively small height is formed. For instance, a bottom portion of the metal contact may be aligned above and between the shorter sides of the lower electrodes.

In example embodiments, a conductive line making contact with a bottom portion of the lower electrodes may be formed on the substrate.

In example embodiments, an upper surface of the lower electrode at the portion facing the metal contact may be positioned lower than a bottom portion of the supporting layer pattern.

In example embodiments, the supporting layer pattern may have a pattern shape including a hole, and the metal contact may be positioned so as to face an inner portion of the hole.

In example embodiments, the supporting layer pattern may have a line shape and the metal contact may be positioned so as to face a gap portion between the supporting layer patterns.

In example embodiments, a capacitor including the lower electrode, the dielectric layer, the upper electrode, and the supporting layer pattern may be positioned in a peripheral region of the substrate.

In example embodiments, a capacitor including the lower electrode, the dielectric layer, the upper electrode, and the supporting layer pattern may be further provided in a cell region of the substrate.

In example embodiments, the lower electrode or the supporting layer pattern may be provided at a portion deviated from the portion facing the metal contact. For instance, the lower electrode or supporting layer pattern may be overlapped by the metal contact.

In a method of manufacturing a semiconductor device according to example embodiments, preliminary lower electrodes and a supporting layer supporting upper sidewalls of the preliminary lower electrodes may be formed. The supporting layer and an upper portion of the preliminary lower electrodes may be partially etched to form lower electrodes having different heights depending on their positions and to form a supporting layer pattern making contact with the lower electrodes having a relatively large height. A dielectric layer may be formed on the lower electrodes and the supporting layer pattern. An upper electrode having a planar upper surface may be formed on the dielectric layer. An inter-metal dielectric layer may be formed on the upper electrode. A metal contact penetrating the inter-metal dielectric layer and making a contact with the upper electrode may be formed. A bottom portion of the metal contact may face a portion where the lower electrode having a relatively small height is formed.

In example embodiments, a conductive line making a contact with a bottom portion of the lower electrodes may be formed on the substrate.

In example embodiments, the portions of supporting layer and the preliminary lower electrodes that will face the metal contact may be partially removed while forming the supporting layer pattern.

In example embodiments, the metal contact may be positioned so as to face a gap portion between the supporting layer patterns.

In example embodiments, the forming of the preliminary lower electrodes and the supporting layer may include forming a first mold layer, the supporting layer, and a second mold layer on the substrate. The second mold layer, the supporting layer, and the first mold layer may be partially etched to form opening portions. The lower electrodes are formed in the opening portions.

In example embodiments, a capping layer may be formed in the opening portions including the lower electrodes and on the second mold layer.

In example embodiments, the capping layer, the first mold layer, and second mold layer may be removed after forming the supporting layer pattern.

In example embodiments, the supporting layer pattern may have a pattern shape including a hole or a line shape.

In example embodiments, a capacitor including the lower electrode, the dielectric layer, the upper electrode, and the supporting layer pattern may be formed in a peripheral region of the substrate.

According to example embodiments, semiconductor devices may exclude a lower electrode of a capacitor around a portion facing a bottom portion of a metal contact or may include a lower electrode having a relatively small thickness. Accordingly, a generation of a bridge defect between a metal contact and a lower electrode may be reduced and thus a generation of a leakage current defect of the semiconductor devices may be restrained. The semiconductor devices in accordance with example embodiments may exhibit a reduced operational defect and a higher reliability.

BRIEF DESCRIPTION OF THE DRAWINGS

Example embodiments will be more clearly understood when the following detailed description is taken in conjunction with the accompanying drawings. FIGS. 1 to 18 represent non-limiting, example embodiments as described herein.

FIG. 1 is a cross-sectional view for explaining a semiconductor device in accordance with an example embodiment.

FIG. 2 is a plan view of the semiconductor device illustrated in FIG. 1.

FIG. 3 is a circuit diagram including capacitors in a peripheral region in the semiconductor device illustrated in FIG. 1.

FIG. 4 is a perspective view of a lower electrode in the semiconductor device illustrated in FIG. 1.

FIG. 6 is a cross-sectional view for explaining a semiconductor device in accordance with another example embodiment.

FIG. 7 is a perspective view of a lower electrode in the semiconductor device illustrated in FIG. 6.

FIG. 8 is a cross-sectional view for explaining a semiconductor device in accordance with another example embodiment.

FIG. 9 is a plan view of the semiconductor device illustrated in FIG. 8.

FIG. 11 is a cross-sectional view for explaining a semiconductor device in accordance with another example embodiment.

FIG. 12 is a plan view of the semiconductor device illustrated in FIG. 11.

FIG. 14 is a cross-sectional view for explaining a semiconductor device in accordance with another example embodiment.

FIG. 15 is a plan view of the semiconductor device illustrated in FIG. 14.

FIG. 17 is a system including a semiconductor device manufactured by a method in accordance with an example embodiment.

FIG. 18 is a device including a semiconductor device manufactured by a method in accordance with another example embodiment.

DETAILED DESCRIPTION

Figure 1:
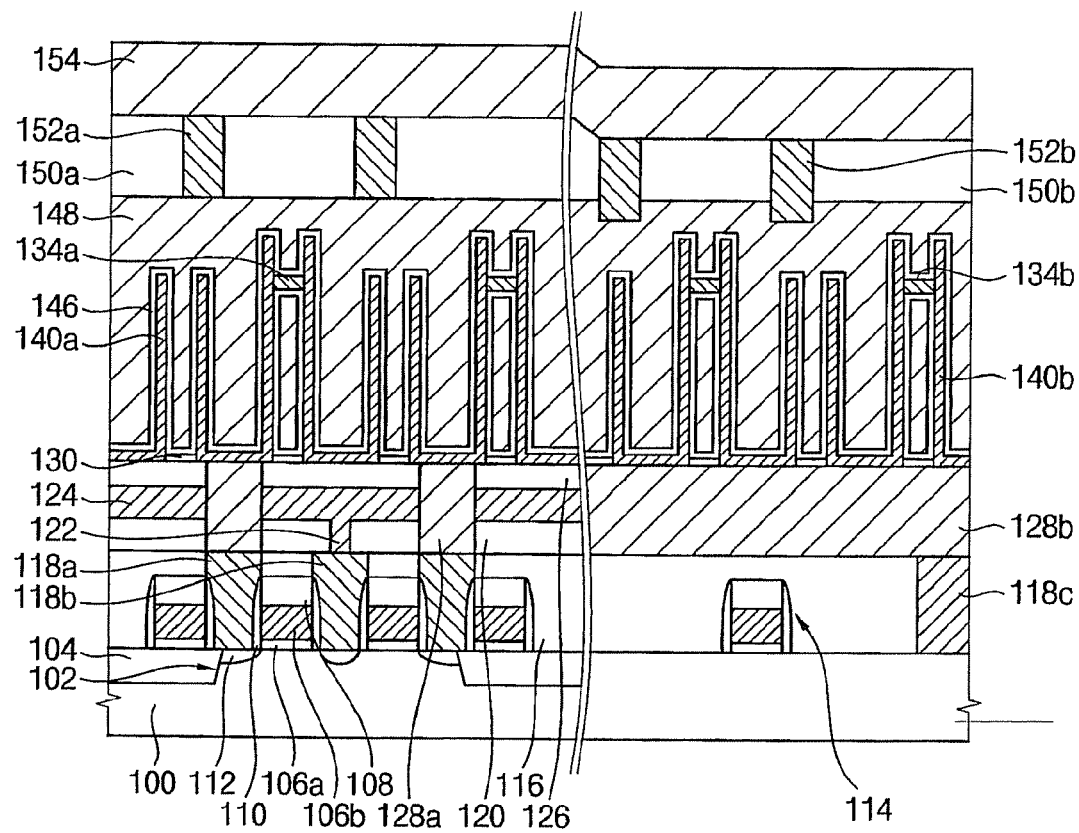
Figure 1:
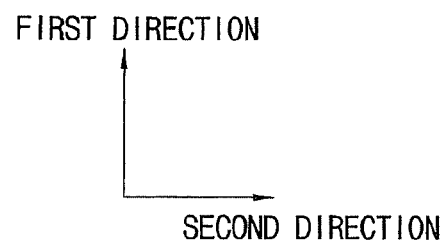

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are merely provided so that this description will be more thorough and complete so as to fully convey the scope of the present inventive concepts to those skilled in the art. In the drawings, the sizes and relative sizes of layers and regions may have been exaggerated for clarity.

It will be understood that when an element or layer is referred to as being "on," "connected to," or "coupled to" another element or layer, it can be directly on, connected or coupled to the other element or layer or intervening elements or layers may be present. In contrast, when an element is referred to as being "directly on," "directly connected to," or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which this inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments on semiconductor devices and methods of manufacturing the same will be explained in further detail.

EXAMPLE EMBODIMENT 1

FIG. 1 is a cross-sectional view for explaining a semiconductor device in accordance with an example embodiment. The semiconductor device may be a DRAM device including a capacitor.

Figure 2:
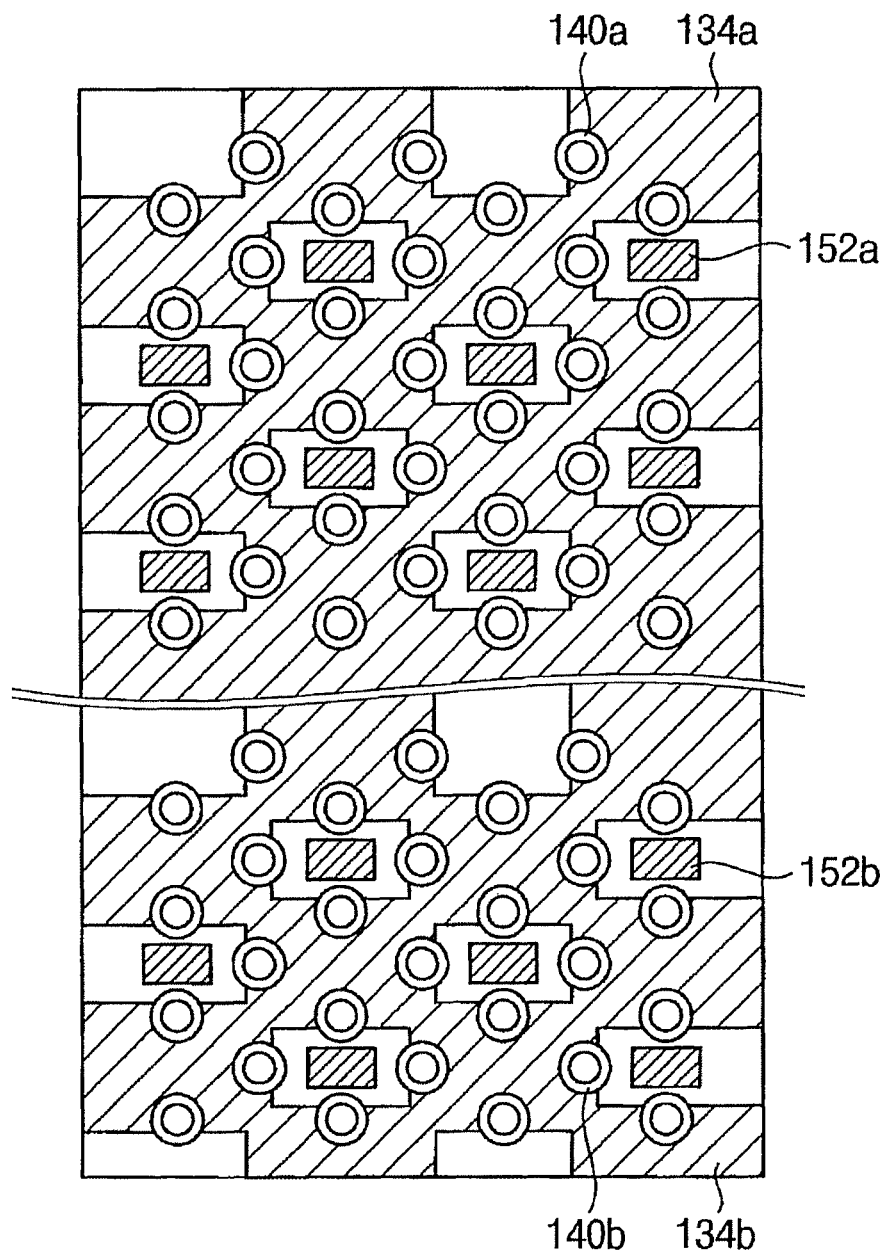
Figure 3:
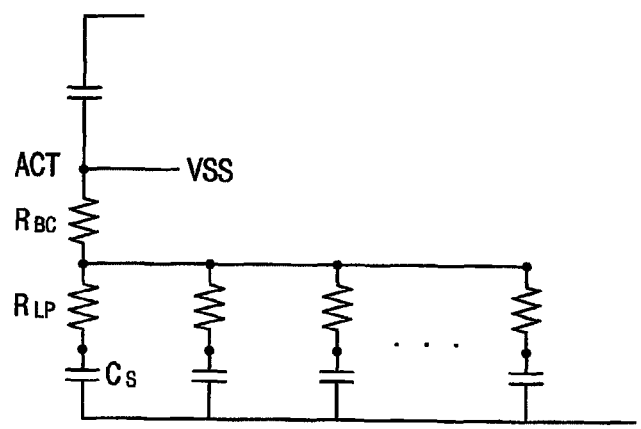
Figure 4:
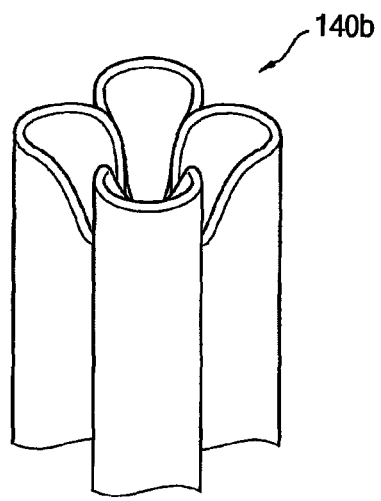

FIG. 2 is a plan view of the semiconductor device illustrated in FIG. 1. FIG. 3 is a circuit diagram including capacitors in a peripheral region in the semiconductor device illustrated in FIG. 1. FIG. 4 is a perspective view of a lower electrode in the semiconductor device illustrated in FIG. 1.

Referring to FIGS. 1 and 2, a semiconductor substrate 100 for forming devices may be prepared. The substrate 100 may include a cell region for forming memory cells and a peripheral region including peripheral circuits for driving the memory cells. In the peripheral region, a plurality of capacitors may be connected in parallel at a portion for driving the circuits by a relatively low voltage. In the forming region of the capacitors in the peripheral circuit region, cylinder type capacitors may be formed as the memory cells in the cell region.

MOS transistors may be provided in the cell region of the substrate 100. A first insulating interlayer 116 covering the MOS transistors may be formed. Through the first insulating interlayer 116, first and second contact pads 118a and 118b respectively making a contact with impurity doped regions 112 included in the MOS transistor may be formed. On the first insulating interlayer 116, a second insulating interlayer 120 may be formed.

Through the second insulating interlayer 120, a bit line contact 122 making a contact with the second contact pad 118b may be formed. A bit line 124 making a contact with the bit line contact 122 extended in a second direction in perpendicular to a first direction may be formed. A third insulating interlayer 126 covering the bit line 124 may be formed on the second insulating interlayer 120.

Through the third insulating interlayer 126 and the second insulating interlayer 120, a storage node contact 128a making a contact with the first contact pad 118a may be formed. On upper surface portion of the storage node contact 128a, cell capacitors may be provided. The cell capacitors may be cylinder type capacitors including first supporting layer patterns 134a for supporting a first lower electrode 140a.

In the peripheral region of the substrate 100, circuits illustrated in FIG. 3 may be provided.

In the peripheral region of the substrate 100, MOS transistors for the peripheral circuits, first, second and third insulating interlayers 116, 120 and 126 and first and second contact plugs 118c and 128b may be formed. The second contact plug 128b exposed through an upper surface portion of the third insulating interlayer 126, may have a line shape extended in the first direction.

On the third insulating interlayer 126, an etch stopping layer pattern 130 may be formed as illustrated in FIG. 1. The etch stopping layer pattern 130 may selectively expose upper surfaces of the storage node contact 128a in the cell region and the second contact plug 128b in the peripheral region. On the upper surface portion of the second contact plug 128b, capacitors for a relatively low voltage may be provided. The capacitors for the relatively low voltage may be a cylinder type capacitor in which a second lower electrode 140b may be supported by the second supporting layer pattern 134b. The capacitors for the relatively low voltage may be provided on the substrate 100 of the peripheral region adjacent to the substrate 100 of the cell region.

The cell capacitor may include a first lower electrode 140a of a cylinder shape, a dielectric layer 146 and an upper electrode 148. In addition, the capacitor for the relatively low voltage may include a second lower electrode 140b of a cylinder shape, the dielectric layer 146 and the upper electrode 148. At a portion of upper sidewall portion of the first and second lower electrodes 140a and 140b, supporting layer patterns 134a and 134b may be provided. The supporting layer pattern in the cell region may be called a first supporting layer pattern 134a and the supporting layer pattern in the peripheral region may be called a second supporting layer pattern 134b.

Referring to FIG. 4, the first and second lower electrodes 140a and 140b having the cylinder shape may have a non-uniform upper surface and may have different heights from portion to portion. Particularly, the first and second lower electrodes 140a and 140b may have a relatively large height at a portion making a contact with the first and second supporting layer patterns 134a and 134b, while having a relatively small height at a portion not making a contact with the first and second supporting layer patterns 134a and 134b. Accordingly, the height of the first and second lower electrodes may be different depending on a shape of the first and second supporting layer patterns 134a and 134b.

The first supporting layer pattern 134a included in the cell capacitor may have one pattern shape including first holes having a contact shape so as to surround a portion of the upper sidewall portion of the regularly arranged first lower electrode 140a. The first lower electrode 140a overlapping the first holes may have a relatively small height.

The second supporting layer pattern 134b included in the capacitor for the relatively low voltage may have one pattern shape including second holes of a contact shape so as to surround a portion of the upper sidewall portion of the regularly arranged second lower electrode 140b. The second holes may have the same size as the first holes or a larger size than the first holes. The second lower electrode 140b overlapping the second holes may have a relatively small height.

The first and second lower electrodes 140a and 140b may include a metal material. The dielectric layer 146 may include metal oxide having a relatively high dielectric constant. The upper electrode 148 may include a metal material and a polysilicon material. On the first and second lower electrodes 140a and 140b formed by using the metal material, a relatively thin dielectric layer 146 may be formed. Then, on the dielectric layer 146, a polysilicon material layer may be formed so as to fill up inner portions of the cylinder shape of the first and second lower electrodes 140a and 140b and to cover upper portions of the cylinder. An upper surface portion of the upper electrode 148 may have a planar surface.

On the upper electrode 148 in the cell region and the peripheral region, first and second inter-metal dielectric layers 150a and 150b may be formed, respectively. Through the first inter-metal dielectric layer 150a, a first metal contact 152a making a contact with the upper electrode 148 may be formed. Through the second inter-metal dielectric layer 150b, a second metal contact 152b making a contact with the upper electrode 148 may be formed. The second inter-metal dielectric layer 150b may have a lower height than the first inter-metal dielectric layer 150a. Because of a pattern density difference between the cell region and the peripheral region, a planarity difference between the upper surfaces of the first and second inter-metal dielectric layers 150a and 150b may be generated.

The first metal contact 152a may be regularly arranged and the position of the first metal contact 152a may not be limited to a certain position. Since a thickness of the first inter-metal dielectric layer 150a in the cell region may be relatively small, a defect of making a contact of the first metal contact 152a with the first lower electrode 140a may be rarely generated although the position of the first metal contact 152a may not be specified. Particularly, the first metal contact 152a may be positioned so as to vertically face an inner portion of the first hole. Alternatively, the first metal contact 152a may be positioned so as to vertically face a deviated portion from the first hole.

The second metal contact 152b may be positioned at a relatively low position of the second lower electrode 140b so as to face an inner portion of the second hole of the second supporting layer pattern 134b. The second supporting layer pattern 134b may not be positioned at the facing position of the second metal contact 152b. Upper surface portion of the second lower electrode 140b facing the second metal contact 152b may be positioned at a lower position than the second supporting layer pattern 134b. By positioning the second metal contact 152b to a portion where the second lower electrode 140b may have a relatively low height, the distance from the upper surface of the second metal contact 152b to the second lower electrode 140b may be increased. Accordingly, a generation of a bridge defect through a contact of the second metal contact 152b and the second lower electrode 140b along with a generation of a leakage current may be restrained.

On the first and second inter-metal dielectric layers 150a and 150b, a wiring line 154 making an electric contact with the first and second metal contacts 152a and 152b may be formed.

FIGS. 5A to 5J are cross-sectional views for explaining a method of manufacturing the semiconductor device illustrated in FIG. 1.

Figure 5A:
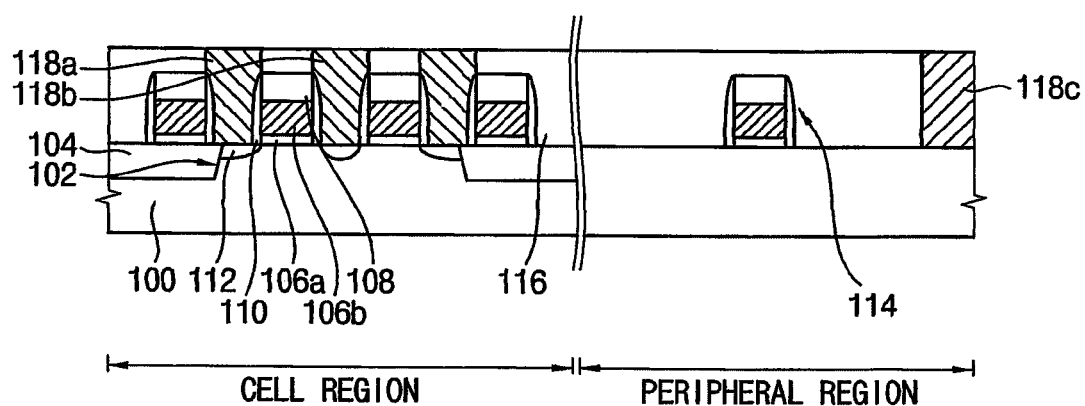
FIGS. 5A to 5J are cross-sectional views for explaining a method of manufacturing the semiconductor device illustrated in FIG. 1.

Referring to FIG. 5A, a device isolation layer pattern 104 may be formed on the substrate 100 divided into the cell region and the peripheral region through performing a trench device isolation process. The substrate 100 may be partially etched to form a trench and the device isolation layer pattern 104 may be formed in the trench. The substrate 100 may be divided into a field region and an active region.

After that, a gate insulating layer 106a may be formed on a surface portion of the active region by a thermal oxidation process. A gate electrode layer using a conductive material and a hard mask layer may be formed. The hard mask layer and the gate electrode layer may be patterned. On the substrate in the cell region, a first gate structure including the gate insulating layer 106a, a gate electrode 106b and a hard mask pattern 108 may be formed. On the substrate in the peripheral region, a second gate structure 114 including the same integrated structure may be formed.

On both sidewall portions of the first and second gate structures, a spacer 110 may be formed using silicon nitride. Into the exposed portion of the substrate 100 at both sides of the spacer 110, impurities may be doped. First and second impurity doped regions 112 provided as a source/drain region may be formed at an upper portion of the substrate in the cell region. In addition, a third impurity doped region (not shown) may be formed at an upper portion of the substrate in the peripheral region. In this case, the impurity doped region formed at both side edge portions of the active region may be called the first impurity doped region and the impurity doped region formed at a center portion of the active region may be called the second impurity doped region.

Through performing the above described processes, a cell transistor may be formed in the cell region and a transistor for a relatively low voltage may be formed in the peripheral region.

A first insulating interlayer 116 covering the first and second gate structures may be formed and a first contact pad 118a and a second contact pad 118b making an electric contact to the first and second impurity doped regions, respectively, may be formed. A first contact plug 118c making an electric contact with the third impurity doped region may be also for med.

Figure 5B:
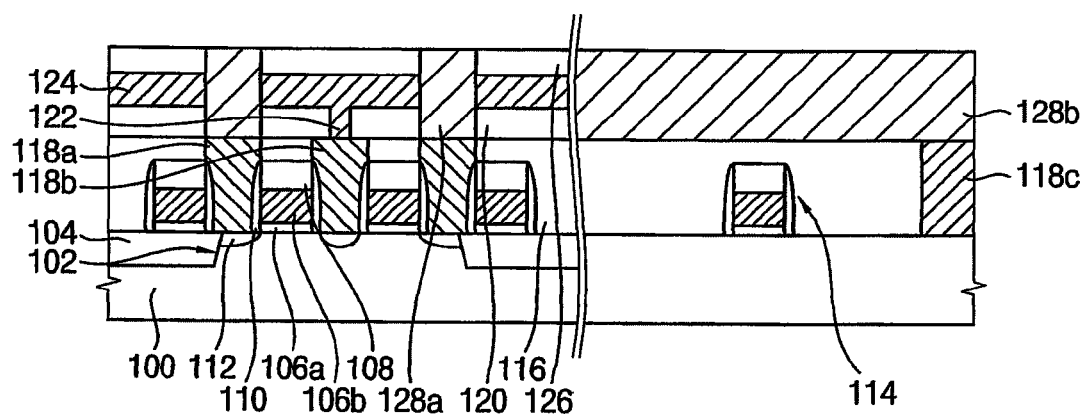

Referring to FIG. 5B, a second insulating interlayer 120 may be formed on the first and second contact pads 118a and 118b and on the first insulating interlayer 116. Through the second insulating interlayer 120, a bit line contact 122 making a contact with the second contact pad 118b may be formed. On the second insulating interlayer 120, a bit line 124 making a contact with the bit line contact 122 may be formed. The bit line contact 122 and the bit line 124 may be formed at the same time by performing a depositing process or may be formed separately by performing depositing processes separately.

A third insulating interlayer 126 covering the bit line 124 may be formed.

The second insulating interlayer 120 and the third insulating interlayer 126 may be partially etched to form contact holes exposing an upper surface portion of the first contact pad 118a. The contact holes may be filled with a conductive material. The conductive material may be polished to form storage node contacts 128a. While forming the storage node contacts 128a, second contact plugs 128b having a line shape may be formed in the peripheral region.

Figure 5C:
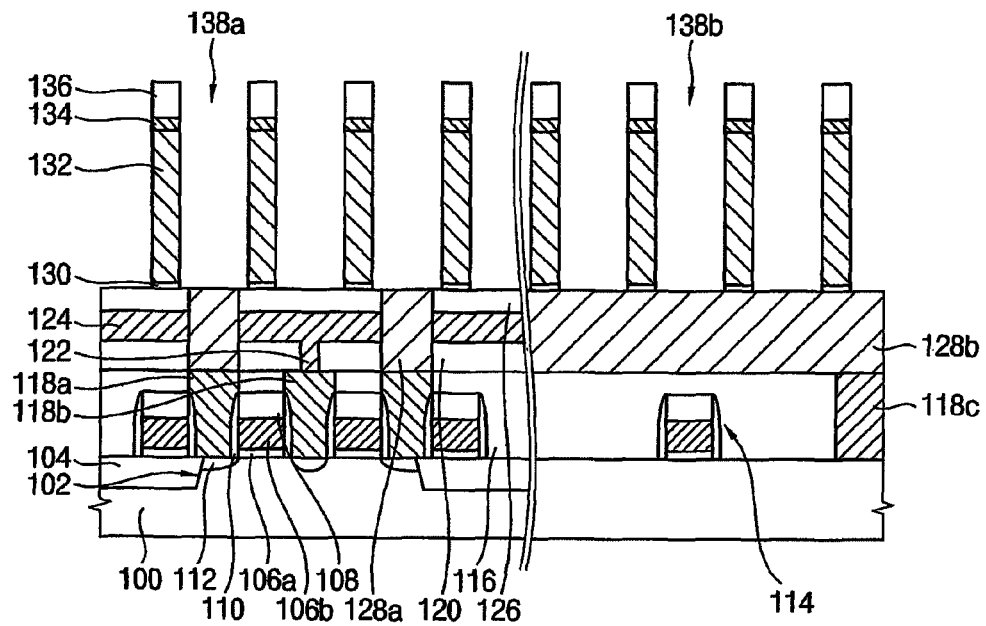

Referring to FIG. 5C, an etch stopping layer may be formed on the third insulating interlayer 126, the storage node contact 128a and the second contact plug 128b. On the etch stopping layer, a first mold layer, a supporting layer, and a second mold layer may be aimed one by one.

The first mold layer may be formed using a first silicon oxide. The first silicon oxide may be an impurity doped silicon oxide. Particularly, the first mold layer may be formed using a silicon oxide including at least one of fluorine (F), boron (B) and phosphorus (P). The first mold layer may be formed using one of BPSG (borophosphosilicate glass), FSG (fluorosilicate glass) and PSG (phosphosilicate glass). These materials may be used alone or in combination.

The supporting layer may be formed using a material having an etching selectivity with respect to the first mold layer.

Particularly, the supporting layer may be formed using silicon nitride. Alternatively, the supporting layer may be formed using silicon oxide which has a relatively high etching selectivity with respect to the first silicon oxide.

The second mold layer may be formed by using a material having a relatively high etching selectivity with respect to the supporting layer. Particularly, the second mold layer may be formed using a material having substantially the same or similar properties as the first mold layer.

The second mold layer, the supporting layer, the first mold layer and the etch stopping layer may be partially etched one by one to form a first opening portion 138a and a second opening portion 138b in the cell region and the peripheral region, respectively. Through the etching process, an etch stopping layer pattern 130, a first mold layer pattern 132, a preliminary supporting layer pattern 134 and a second mold layer pattern 136 may be formed. The first opening portion 138a may be aimed so as to expose the storage node contact 128a at a bottom portion thereof. The second opening portion 138b may be formed to expose the second contact plug 128b at a bottom portion thereof. The first and second opening portions 138a and 138b may be arranged in regular patterns.

Figure 5D:
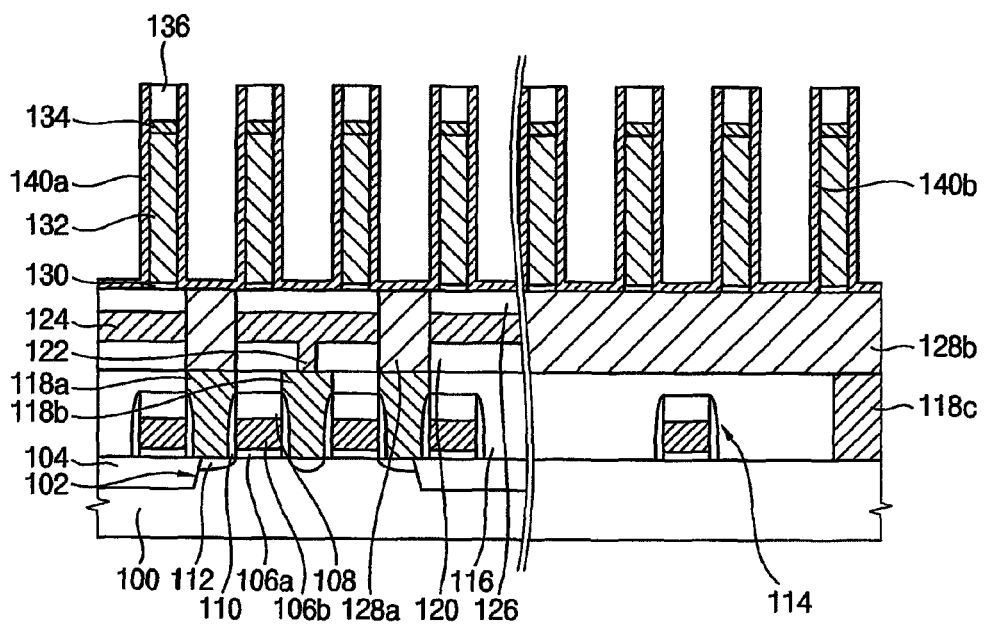

Referring to FIG. 5D, a conductive layer (not illustrated) may be uniformly formed along sidewall portions of the first and second opening portions 138a and 138b and on an upper surface portion of the second mold layer pattern 136. The conductive layer may be formed by using polysilicon, a metal, or metal nitride. A chemical vapor deposition (CVD) process may be applied to form the conductive layer. Particularly, the conductive layer may be formed using titanium and/or titanium nitride.

A sacrificial layer (not illustrated) filling up the inner portion of the opening portions including the conductive layer formed thereon may be formed. The sacrificial layer may be formed using a material that may be applied with relative ease by a spin coating and may be removed with relative ease by performing an asking process.

The sacrificial layer and the conductive layer may be removed to expose an upper surface portion of the second mold layer pattern 136 and to form lower electrodes 140a and 140b having cylinder shapes. The lower electrode formed in the cell region may be called a first lower electrode 140a and the lower electrode formed in the peripheral region may be called a second lower electrode 140b. The removal of the sacrificial layer and the conductive layer may be performed by a blanket etch back process.

Figure 5E:
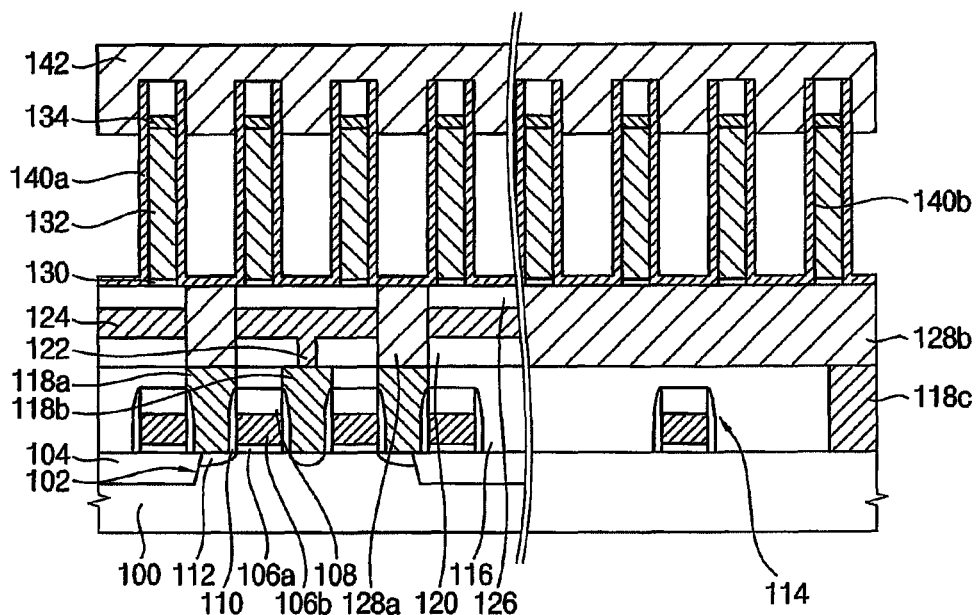

Referring to FIG. 5E, a capping layer 142 covering upper surfaces of the first and second lower electrodes 140a and 140b having the cylindrical shape and the second mold layer pattern 136 may be formed. The capping layer 142 may be formed on the sacrificial layer remaining in the first and second lower electrodes 140a and 140b. The capping layer 142 may be formed using a material that may be removed with relative ease by an etching gas or an etching solution. Particularly, the capping layer 142 may be formed using TEOS (tetraethyl orthosilicate).

Figure 5F:
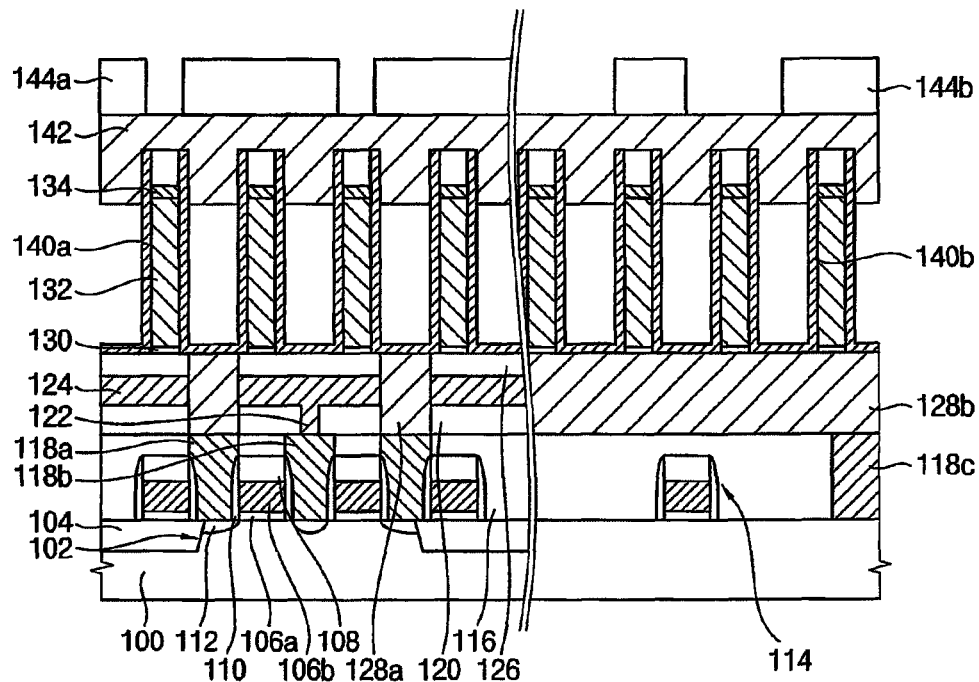

Referring to FIG. 5F, a photoresist layer may be coated on the capping layer 142 and then exposed and developed to form first and second etching mask patterns 144a and 144b in the cell region and the peripheral region, respectively. The first and second etching mask patterns 144a and 144b may have a shape selectively covering portions where first and second supporting layer patterns may be formed. Particularly, the first and second etching mask patterns 144a and 144b may have a shape including holes.

The first etching mask pattern 144a formed in the cell region and the second etching mask pattern 144b formed in the peripheral region may have the same or different shape. Alternatively, the shapes of the first and second etching mask patterns 144a and 144b may be the same but the size of the holes included in each mask pattern may be different. The hole included in the second etching mask pattern 144b may be larger than that included in the first etching mask pattern 144a.

Figure 5G:
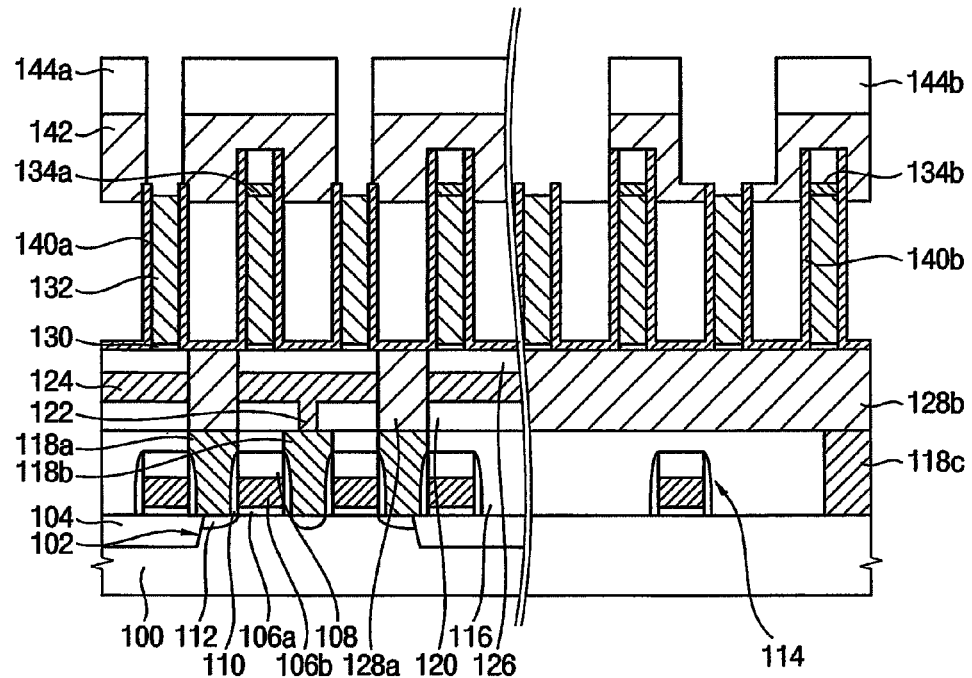

Referring to FIG. 5G, the capping layer 142 and the preliminary supporting layer pattern 134 may be etched using the first and second etching mask patterns 144a and 144b. The first and second supporting layer patterns 134a and 134b may be formed in the cell region and the peripheral region as illustrated in FIG. 2. While performing the etching process to form the first and second supporting layer patterns 134a and 134b, the lower electrode adjacent to the preliminary supporting layer pattern 134 to be etched may be partially etched and an upper portion of the lower electrode may be removed. Accordingly, the lower electrode formed at a position not including the first and second supporting layer patterns 134a and 134b may be shorter than the lower electrode formed at a position including the first and second supporting layer patterns 134a and 134b.

Figure 5H:
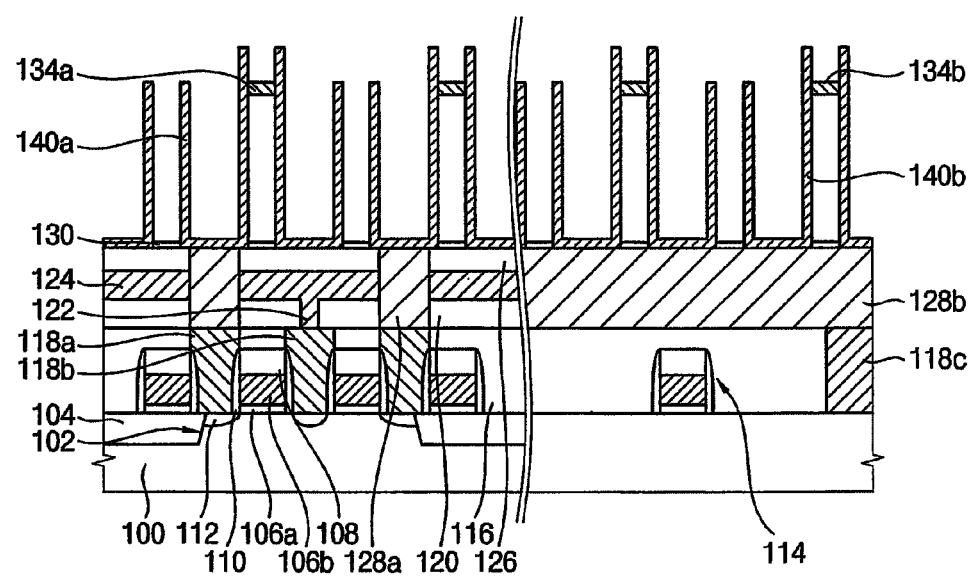

Referring to FIG. 5H, the capping layer 142 and the first and second mold layer patterns 132 and 136 may be removed. The removal process may be performed by an isotropic etching process using an etching solution or an etching gas. While performing the removal process, the first and second supporting layer patterns 134a and 134b may not be removed but may remain. An ashing process may be performed to completely remove remaining sacrificial layer and etching residue. Through performing the above process, the surface portion of the cylinder of the first and second lower electrodes 140a and 140b may be exposed.

Figure 5I:
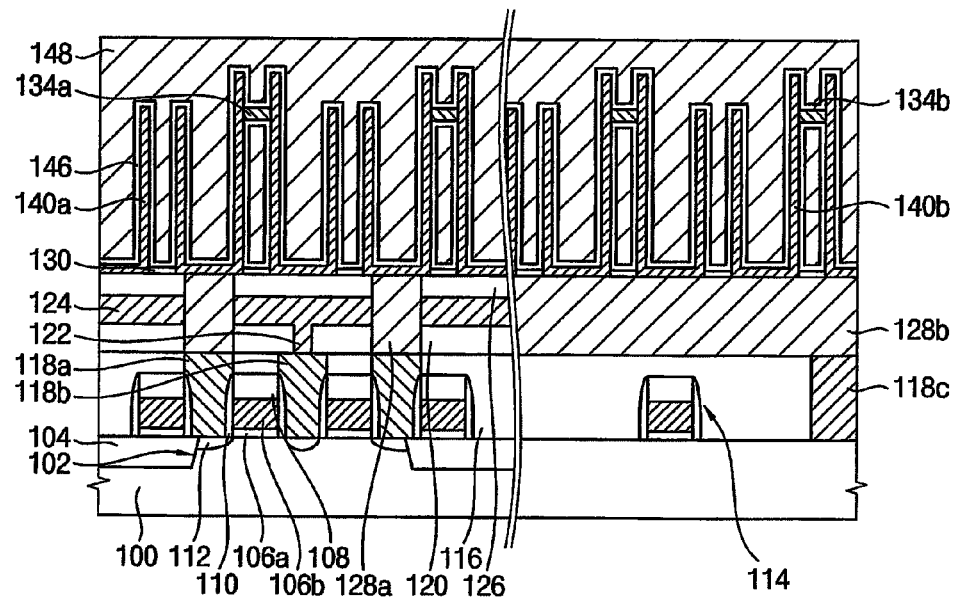

Referring to FIG. 5I, a dielectric layer 146 and an upper electrode 148 may be formed along surface portions of the first and second lower electrodes 140a and 140b and along the etch stopping layer pattern 130. The dielectric layer 146 may be formed using silicon oxide or a material having a relatively high dielectric constant. The upper electrode 148 may be formed using an impurity doped polysilicon, a metal, or a metal nitride. Particularly, the upper electrode 148 may be formed by forming a relatively thin film using the metal or the metal nitride and then, by depositing polysilicon so that an inner portion of the cylinder of the first and second lower electrodes 140a and 140b may be completely filled. Particularly, the upper electrode 148 may have a planar upper surface. Through performing the above described processes, a cell capacitor may be formed in the cell region and a capacitor for a relatively low voltage may be formed in the peripheral region.

Figure 5J:
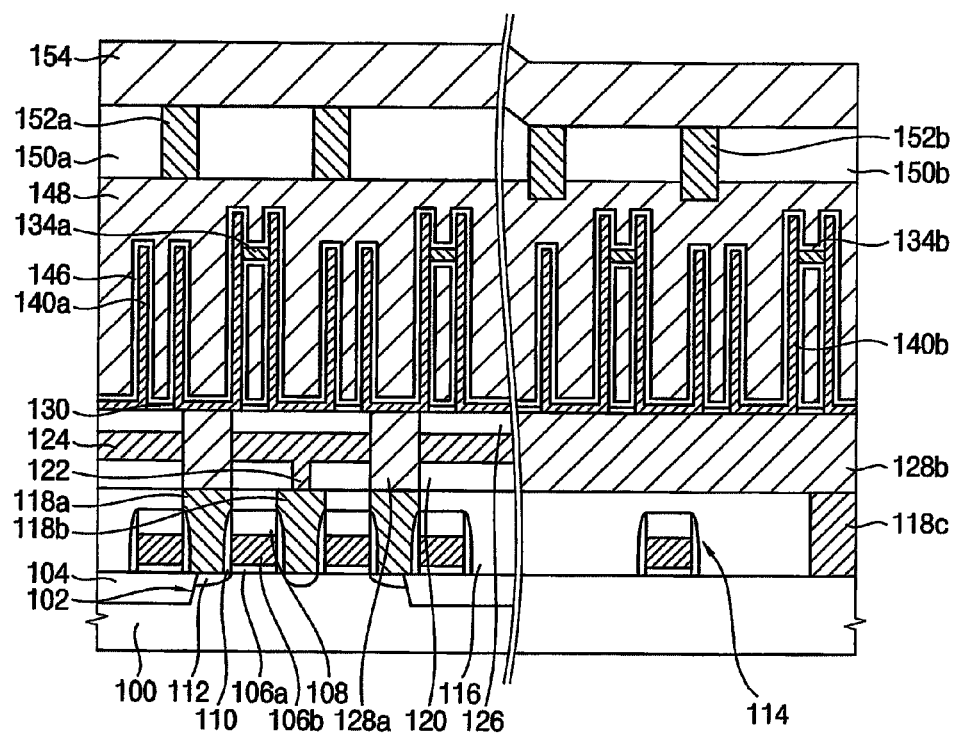

Referring to FIG. 5J, an insulating layer may be formed on the upper electrode 148 and then planarized to form first and second inter-metal dielectric layers 150a and 150b. The density of the underlying patterns may be relatively high in the cell region. However, the density of the underlying patterns may be relatively low in the peripheral region when compared to the cell region. After performing a polishing process to planarize the insulating layer, the second inter-metal dielectric layer 150b in the peripheral region may be higher than the first inter-metal dielectric layer 150a in the cell region.

The first and second inter-metal dielectric layers 150a and 150b may be partially etched to form first contact holes exposing the upper electrode 148 in the cell region and to form second contact holes exposing the upper electrode 148 in the peripheral region.

The second contact holes may be formed in regular patterns in portions where the thickness from the second lower electrode 140*b* may be relatively large, that is, in positions where the second supporting layer pattern 134*b* may not be formed. In this case, a defect exposing the second lower electrode 140*b* at bottom portions of the second contact holes may not be generated while forming the second contact holes although the second inter-metal dielectric layer 150*b* and the upper electrode 148 may be over etched. Particularly, the second inter-metal dielectric layer 150*b* may be formed relatively thinly in the peripheral region and the exposing defect of the second lower electrode 140*b* may be frequently generated through the over etching. The exposing defect may be restrained by forming the second contact holes facing the position deviated from the position including the underlying second supporting layer pattern 134*b*. In addition, the portion for forming the second contact holes and excluding the second supporting layer pattern 134*b* may be wider when compared to the same portion in the cell region to confirm the portion for forming the second contact holes sufficiently.

Since the first inter-metal dielectric layer 150*a* in the cell region may be relatively thick and the formation of the first contact holes in regular patterns may be accomplished without limiting any portion for forming the first contact holes. However, the first contact holes may be also formed in regular patterns so that the first contact holes may be positioned at portions having relatively large distance to the first lower electrode 140*a* and so may be formed at a portion deviated from the portions including the first supporting layer pattern 134*a*.

In the first and second contact holes, a metal layer may be formed to obtain a first metal contact 152*a* and a second metal contact 152*b*, respectively. On the first and second inter-metal dielectric layers 150*a* and 150*b*, a wiring line 154 making an electric contact with the first and second metal contacts 152*a* and 152*b* may be formed.

As described above, a generation of a bridge defect between the metal contact and the lower electrode frequent in the peripheral region may be restrained. Semiconductor devices having a higher performance may be manufactured.

EXAMPLE EMBODIMENT 2

Figure 6:
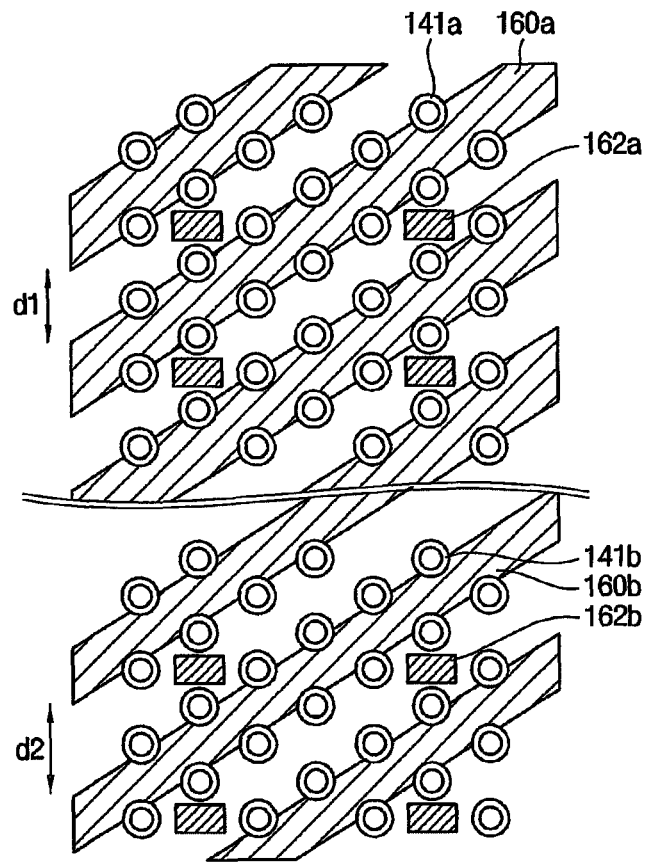
Figure 7:
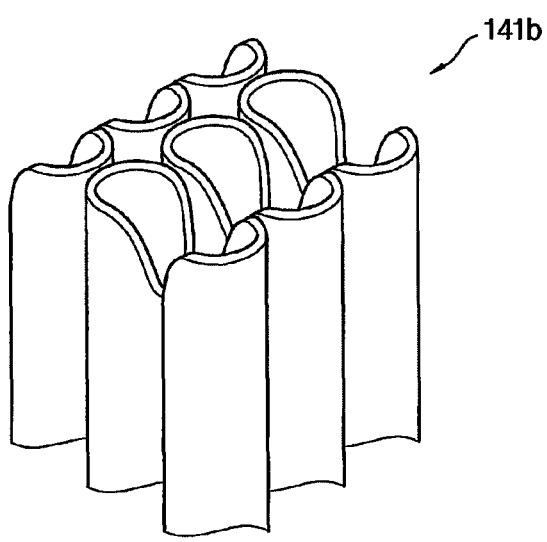

FIG. 6 is a cross-sectional view of a semiconductor device in accordance with another example embodiment. FIG. 7 is a perspective view of a lower electrode in the semiconductor device illustrated in FIG. 6.

The semiconductor device illustrated in FIG. 6 may have the same structure illustrated in Example Embodiment 1 except for the shape of the first and second supporting layer patterns and the position of the second metal contact. Explanation on the same elements for the semiconductor device as in Example Embodiment 1 will be omitted or will be given briefly hereinafter.

Referring to FIGS. 6 and 7, a first supporting layer pattern 160*a* included in a cell capacitor may have a line shape connecting one side portions of neighboring first lower electrodes 141*a* along a diagonal line. In addition, a second supporting layer pattern 160*b* included in a capacitor for a relatively low voltage may have a line shape connecting one side portions of neighboring second lower electrodes 141*b* along a diagonal line as in the first supporting layer pattern 160*a*. In this case, the second supporting layer pattern 160*b* may have a narrower width than the first supporting layer pattern 160*a*. Accordingly, a gap d2 between the neighboring second supporting layer patterns 160*b* may be wider than a gap d1 between the neighboring first supporting layer patterns 160*a*.

The first and second lower electrodes 141*a* and 141*b* at positions supported by the first and second supporting layer patterns 160*a* and 160*b* may have a relatively large height, while the first and second lower electrodes 141*a* and 141*b* at positions not supported by the first and the second supporting layer patterns 160*a* and 160*b* may have a relatively small height.

First and second inter-metal dielectric layers 150*a* and 150*b* covering the cell capacitor and the capacitor for the relatively low voltage may be formed. Through the first inter-metal dielectric layer 150*a* in the cell region, a first metal contact 162*a* making a contact with an upper electrode 148 may be formed. Through the second inter-metal dielectric layer 150*b* in the peripheral region, a second metal contact 162*b* making a contact with the upper electrode 148 may be formed.

Since the first inter-metal dielectric layer 150*a* may be relatively thick, the position of the first metal contact 162*a* may not be specified. Particularly, a bottom portion of the first metal contact 162*a* may vertically face the gap d1 between the first supporting layer patterns 160*a*. Alternatively, the first metal contact 162*a* may be regularly arranged regardless of the position of the first supporting layer pattern 160*a*.

The second metal contact 162*b* in the peripheral region may be formed so as to face the gap d2 between the second supporting layer patterns 160*b*. Accordingly, the second metal contact 162*b* may be positioned so as to face the second lower electrode 141*b* having a relatively low height.

The semiconductor device in Example Embodiment 2 may be formed through performing the same processes illustrated in Example Embodiment 1. However, the positions of the first and second supporting layer patterns 160*a* and 160*b* and the second metal contact 162*b* may be different. Accordingly, an exposed portion of the etching mask pattern explained referring to FIG. 5F and an exposed portion of the etching mask pattern while forming the contact holes explained referring to FIG. 5J may be different from Example Embodiment 1.

EXAMPLE EMBODIMENT 3

Figure 8:
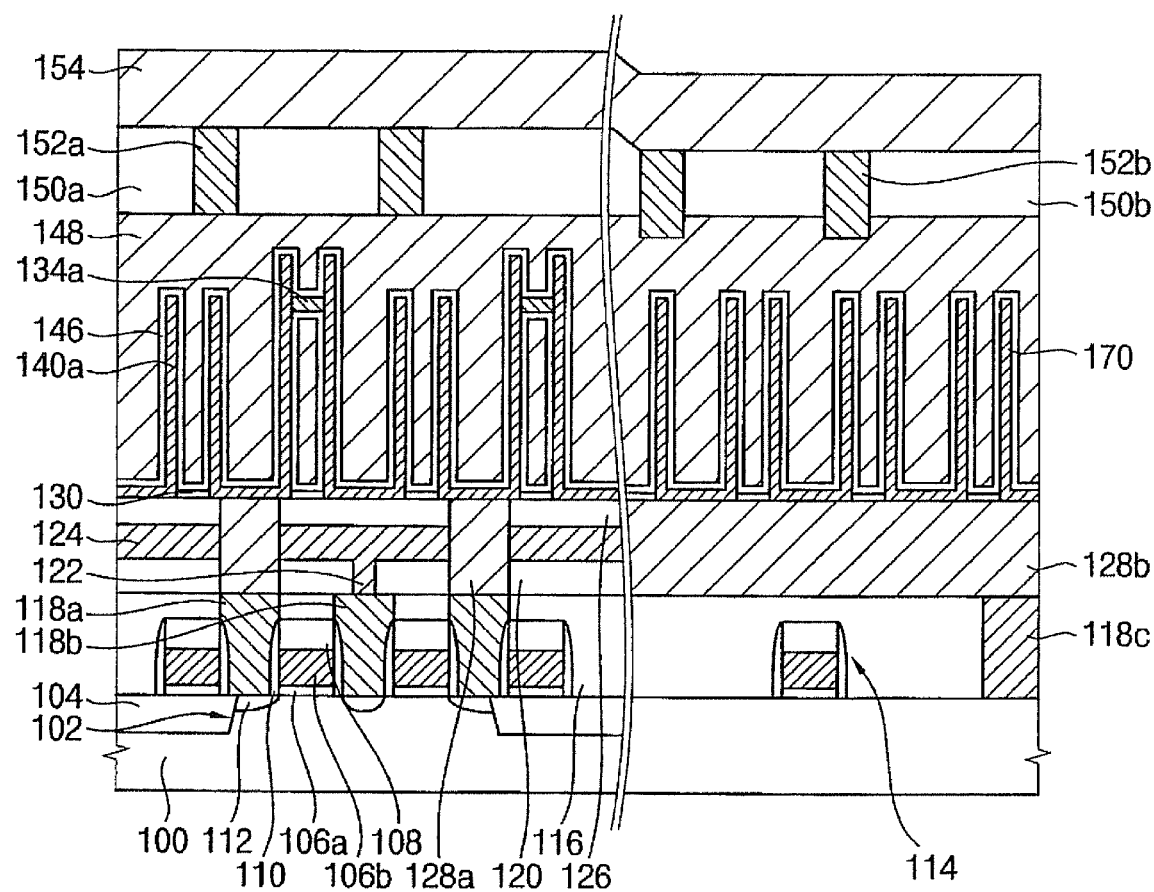
Figure 9:
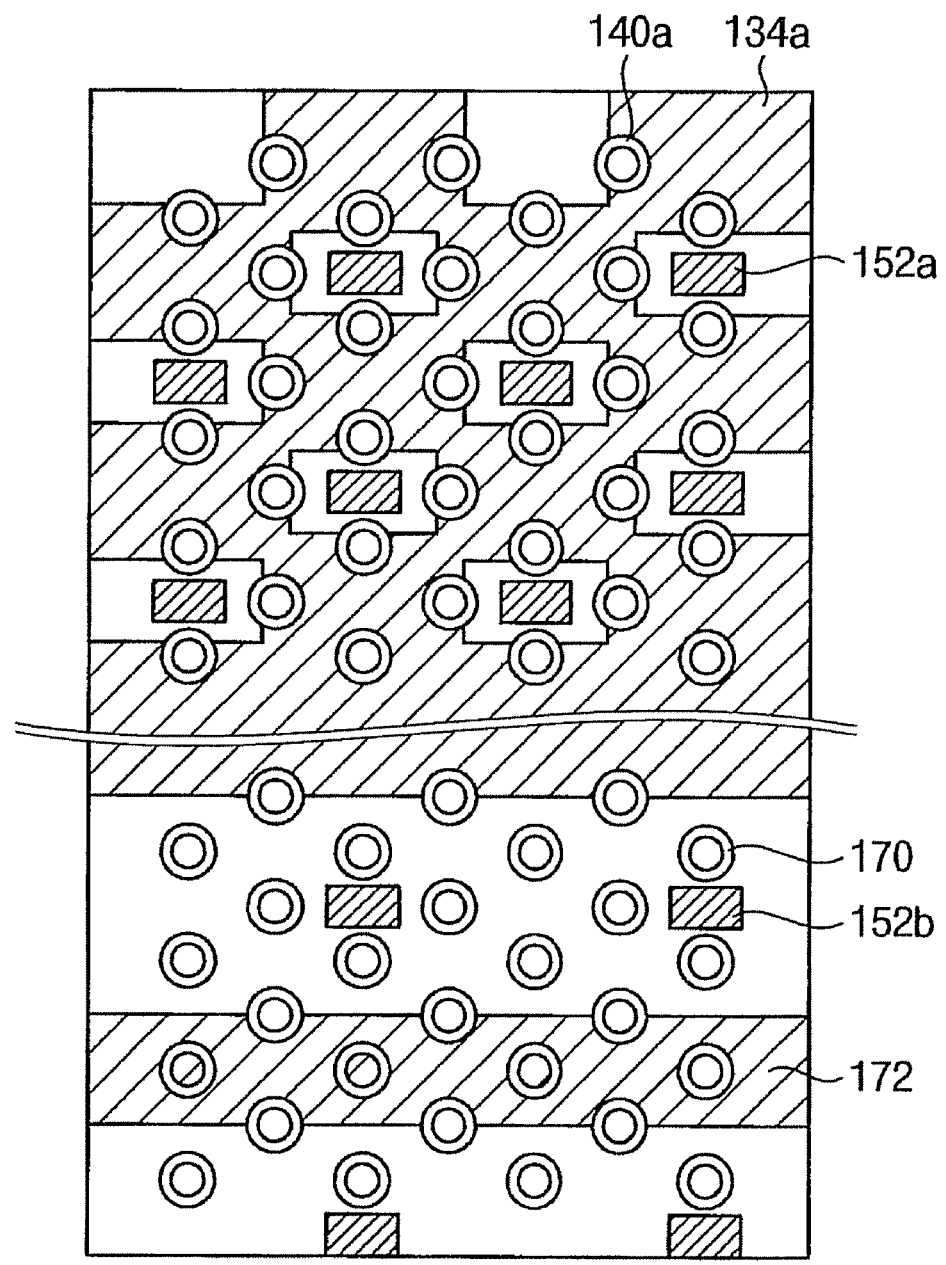

FIG. 8 is a cross-sectional view of a semiconductor device in accordance with another example embodiment. FIG. 9 is a plan view of the semiconductor device illustrated in FIG. 8.

In the semiconductor device in FIG. 8, the structure under the capacitor may be the same as the structure illustrated in Example Embodiment 1. Explanation on the same elements for the semiconductor device as in Example Embodiment 1 will be omitted or will be given briefly hereinafter.

Referring to FIGS. 8 and 9, a cell capacitor and a capacitor for a relatively low voltage may include a lower electrode of a cylinder shape, a dielectric layer, and an upper electrode.

A first supporting layer pattern 134*a* included in the cell capacitor may have one pattern shape including first holes having a contact shape surrounding a portion of upper sidewall portion of first lower electrodes 140*a* arranged in regular patterns. The first lower electrode 140*a* near the first holes may have a relatively small height.

A second supporting layer pattern 172 included in the capacitor for the relatively low voltage may have a line shape extended in one direction and may connect sidewalls of neighboring second lower electrodes 170. A gap portion between the second supporting layer patterns 172 may also have a line shape. The second supporting layer patterns 172 may be formed so that a portion for forming a second metal contact 152*b* and a portion near the second metal contact 152*b* may face the gap portion between the second supporting layer patterns 172.

On upper electrodes 148 in the cell region and the peripheral region, first and second inter-metal dielectric layers 150*a* and 150b may be formed. The second inter-metal dielectric layer 150b provided in the peripheral region may have a smaller height than the first inter-metal dielectric layer 150a provided in the cell region.

In the cell region, a first metal contact 152a making a contact with the upper electrode 148 may be formed. The first metal contacts 152a may be arranged regularly and the positions thereof may not be limited. Particularly, the first metal contact 152a may be positioned so as to face an inner portion of the first hole as illustrated in FIG. 9.

In the peripheral region, the second metal contacts 152b making a contact with the upper electrode 148 may be formed. The second metal contacts 152b may be arranged in regular patterns while facing the gap between the second supporting layer patterns 172. That is, the second supporting layer patterns 172 may not be provided to the second lower electrode 170 positioned under the second metal contacts 152b. The second lower electrode 170 provided under the second metal contacts 152b may have a smaller height than the lower electrode 170 supported by the second supporting layer patterns 172. Upper surface portion of the second lower electrode 170 at the portion facing the second metal contacts 152b may be positioned at a lower portion than a bottom portion of the second supporting layer patterns 172.

Since the second supporting layer patterns 172 may not be provided to the second lower electrode 170 at a certain region under the second metal contact 152b, a generation of a bridge defect through a contact between the second metal contact 152b and the lower electrode 170 may be restrained. Further, a generation of a leakage current may be reduced.

FIGS. 10A to 10D are cross-sectional views for explaining a method of manufacturing the semiconductor device illustrated in FIG. 8.

The same structure illustrated in FIG. 5E may be formed by performing the same processes explained referring to FIGS. 5A to 5E.

Figure 10A:
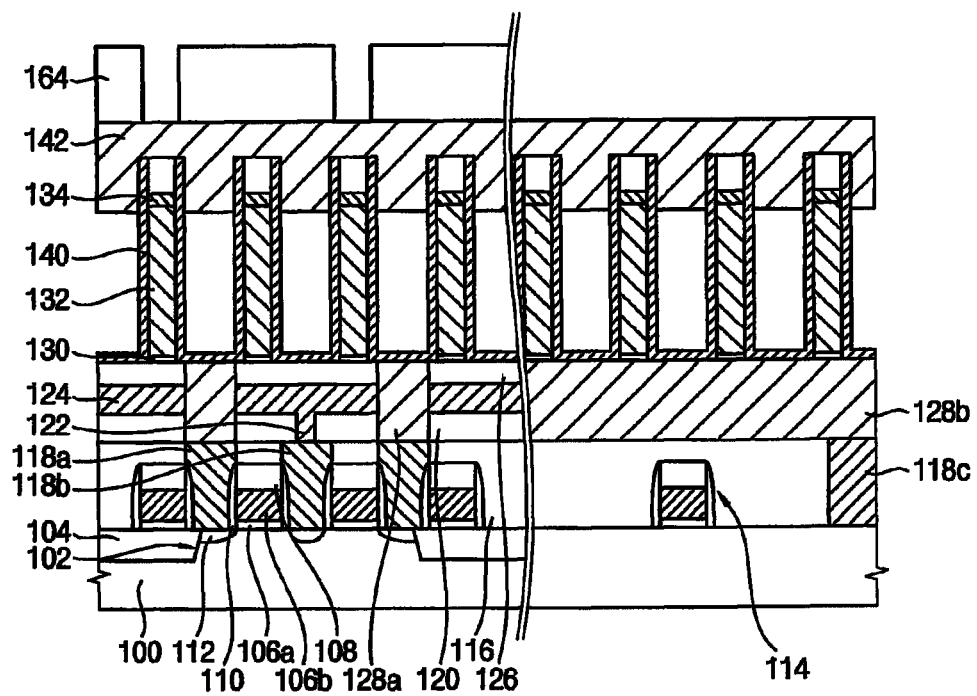
FIGS. 10A to 10D are cross-sectional views for explaining a method of manufacturing the semiconductor device illustrated in FIG. 8.

Referring to FIG. 10A, a photoresist layer may be coated on a capping layer 142 and exposed and developed to form an etching mask pattern 164. The etching mask pattern 164 may selectively cover portions where the first and second supporting layer patterns may be formed. In the cell region, an etching mask pattern including holes may be formed and in the peripheral region, an etching mask pattern having a shape exposing portions facing a portion for forming the second metal contact may be formed. The exposed portion may have a line shape.

Figure 10B:
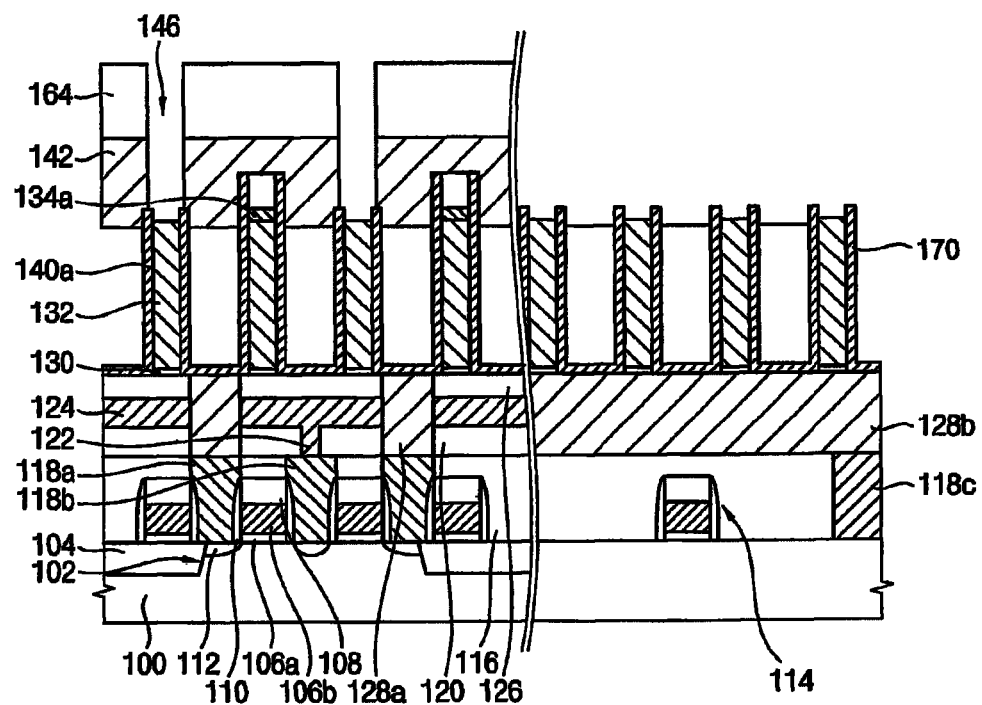

Referring to FIG. 10B, the capping layer 142 and a preliminary supporting layer pattern 134 may be etched using the etching mask pattern 164. First and second supporting layer patterns 134a and 172 having the same shape illustrated in FIG. 9 may be formed. While performing the etching process for forming the first and second supporting layer patterns 134a and 172, first and second lower electrodes adjacent to the preliminary supporting layer pattern 134 to be etched may be partially etched and an upper portion thereof may be removed.

Accordingly, the first lower electrode 140a at a portion not including the first supporting layer pattern 134a may have a smaller height than the first lower electrode 140a at a portion including the first supporting layer pattern 134a. In addition, in a line shape region facing a portion for forming the second metal contact 152b, the second supporting layer pattern 172 may not be formed. Accordingly, the second lower electrode 170 formed in the line shape region may have a relatively small height.

Figure 10C:
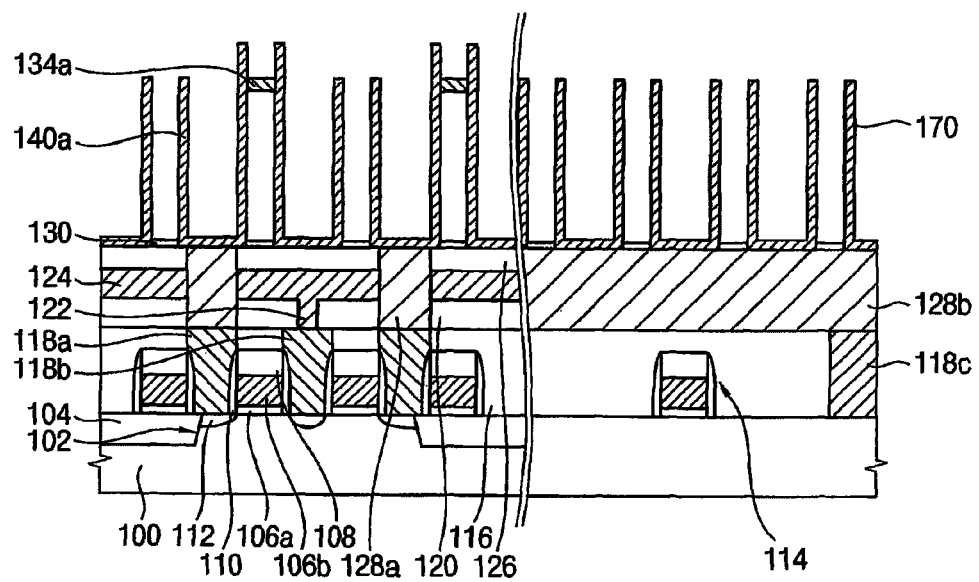

Referring to FIG. 10C, the capping layer 142 and first and second mold layer patterns 132 and 136 may be removed. The removing process may be performed through an isotropic etching process using an etching solution or an etching gas. While performing the removing process, the first and second supporting layer patterns 134a and 172 may not be removed but may remain. An ashing process may be performed to completely remove the remaining sacrificial layer and etching residue. Through performing the process, surface portions of the cylinder of the first and second lower electrodes 140a and 170 may be exposed.

Figure 10D:
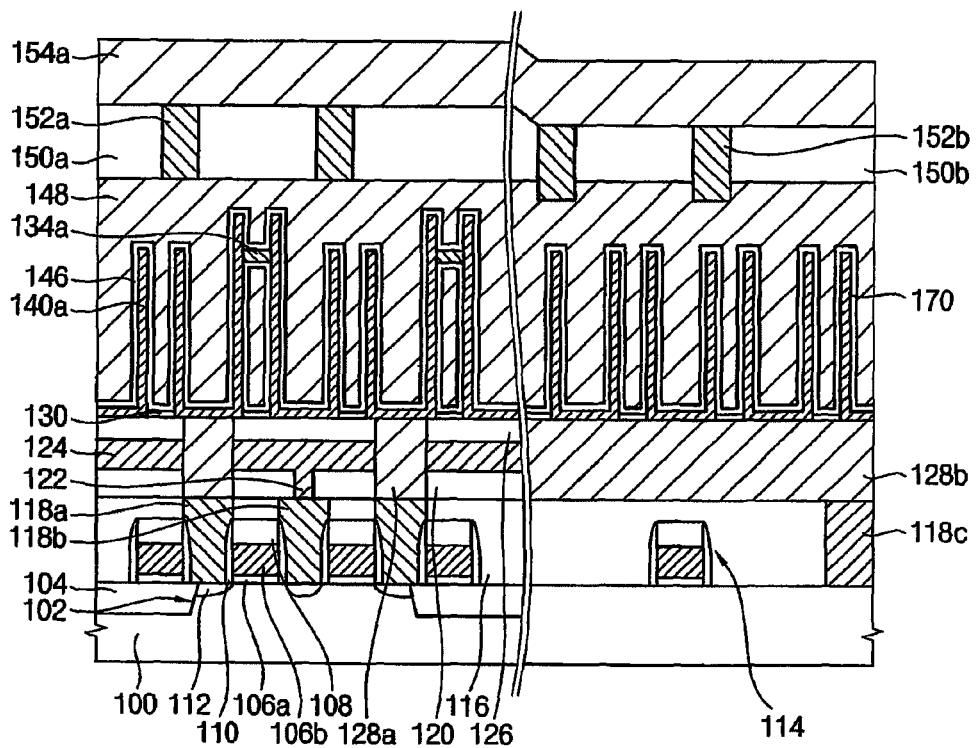

Referring to FIG. 10D, a dielectric layer 146 and an upper electrode 148 may be formed on surface portions of the first and second lower electrodes 140a and 170 and along the etch stopping layer pattern 130. A cell capacitor may be formed in the cell region and a capacitor for a relatively low voltage may be formed in the peripheral region.

An insulating layer may be formed on the upper electrode 148 and may be polished to form first and second inter-metal dielectric layers 150a and 150b. The second inter-metal dielectric layer 150b formed in the peripheral region may have a smaller height than the first inter-metal dielectric layer 150a formed in the cell region. Through the first and second inter-metal dielectric layers 150a and 150b, a first metal contact 152a and a second metal contact 152b may be formed, respectively. Under a portion facing the second metal contact 152b, the second supporting layer pattern 172 may not be formed and so the second metal contact 152b may be formed at a portion including the second lower electrode 170 having a relatively small height.

A generation of a bridge defect between the second lower electrode 170 and the second metal contact 152b in the peripheral region may be reduced.

EXAMPLE EMBODIMENT 4

Figure 11:
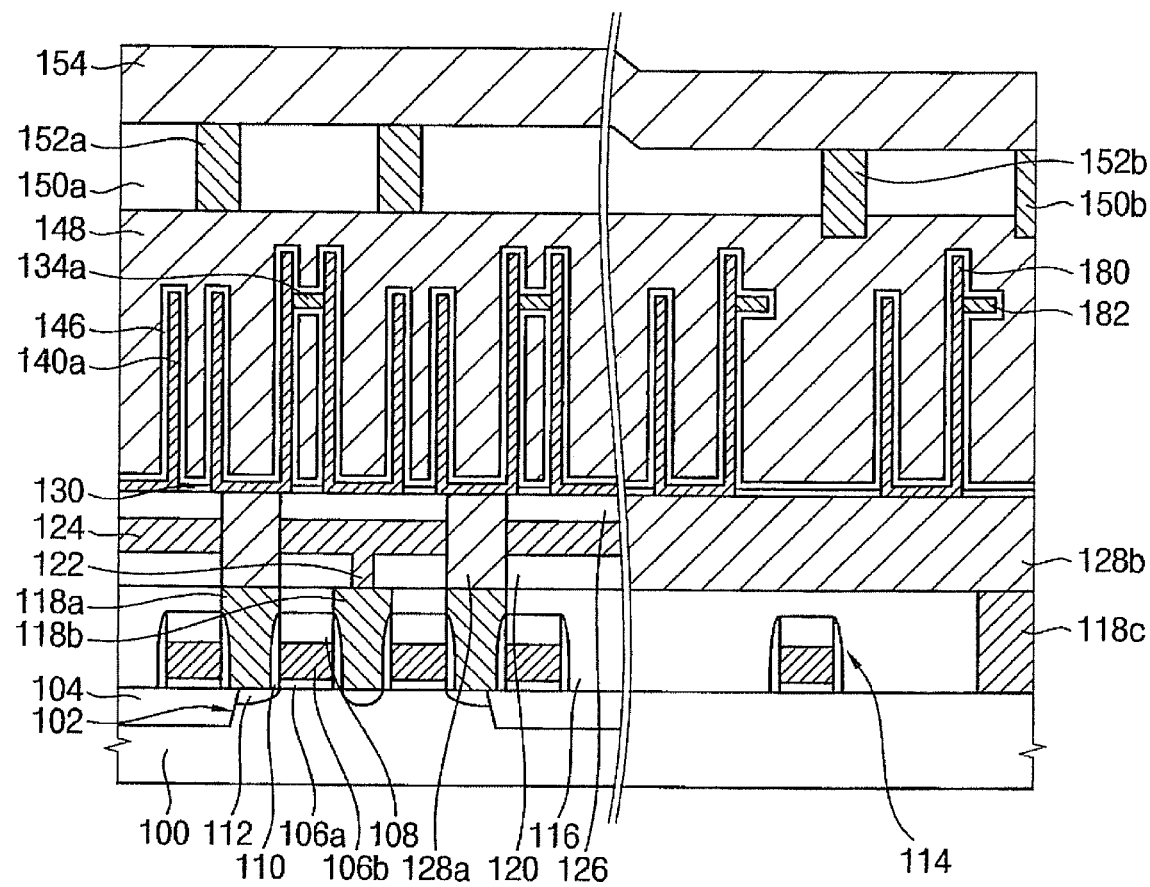
Figure 12:
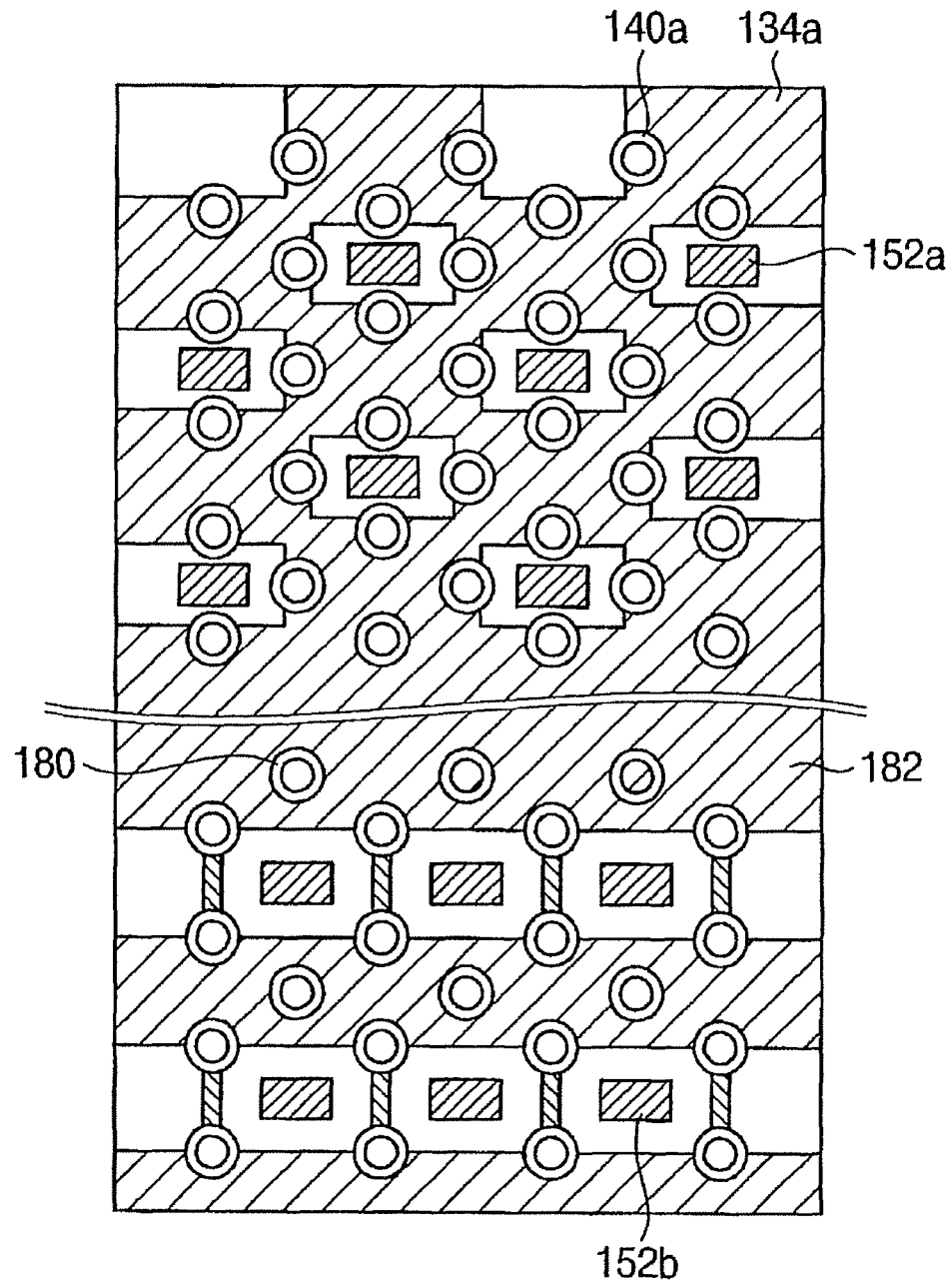

FIG. 11 is a cross-sectional view for explaining a semiconductor device in accordance with another example embodiment. FIG. 12 is a plan view of a semiconductor device illustrated in FIG. 11.

The structure of the semiconductor device illustrated in FIG. 11 may be the same as the structure illustrated in FIG. 1. Explanation on the same elements for the semiconductor device as in Example Embodiment 1 will be omitted or will be given briefly hereinafter.

Referring to FIGS. 11 and 12, a cell capacitor may include a first lower electrode 140a having a cylinder shape, a dielectric layer 146, and an upper electrode 148. A capacitor for a relatively low voltage may include a second lower electrode 180 having a cylinder shape, a dielectric layer 146 and an upper electrode 148.

At a portion for forming a second metal contact 152b and a portion facing the second metal contact 152b, the second lower electrode 180 may not be aimed. The second lower electrode 180 may be formed to have a regular arrangement, however, the second lower electrode 180 may not be formed at a portion including the second metal contact 152b and a portion facing the second metal contact 152b.

A first supporting layer pattern 134a included in the cell capacitor may have one pattern shape including first holes having a contact hole shape surrounding a portion of upper sidewall of the first lower electrode 140a arranged regularly. The first lower electrode 140a positioned within the first holes may have a relatively small height.

A second supporting layer pattern 182 included in the capacitor for the relatively low voltage may have one pattern shape including second holes at a portion excluding the second lower electrode 180.

First and second inter-metal dielectric layers 150a and 150b may be formed on the upper electrode 148 in the cell region and the peripheral region. The second inter-metal dielectric layer 150b in the peripheral region may have a smaller height than the first inter-metal dielectric layer 150a in the cell region.

First metal contacts 152a making a contact with the upper electrode 148 may be formed in the cell region. The first metal contacts 152a may be arranged regularly and the positions thereof may be unlimited. Particularly, the first metal contacts 152a may be positioned facing the first lower electrodes 140a.

The second metal contacts 152b making contact with the upper electrode 148 may be formed in the peripheral region. The second metal contacts 152b may be arranged regularly while facing a portion excluding the second lower electrodes 180. Since the second lower electrodes 180 may not be provided under the second metal contacts 152b, a generation of a bridge defect through a contact between the second metal contacts 152b and the second lower electrodes 180 may be restrained. Further, a generation of a leakage current may be reduced or prevented.

FIGS. 13A to 13D are cross-sectional views for explaining a method of manufacturing the semiconductor device illustrated in FIG. 11.

The structure illustrated in FIG. 5B may be formed through performing processes explained referring to FIGS. 5A and 5B.

Figure 13A:
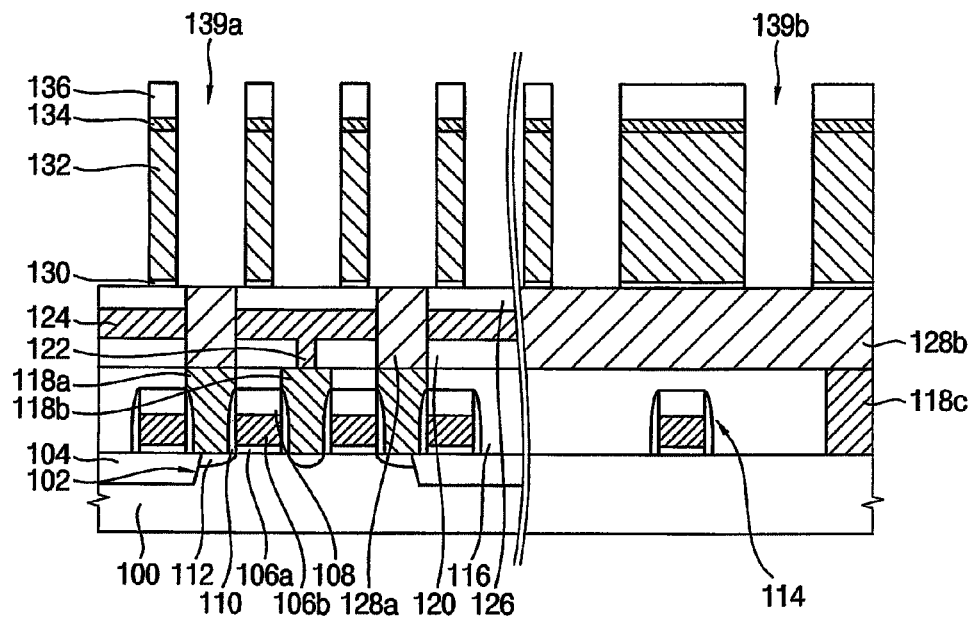
FIGS. 13A to 13D are cross-sectional views for explaining a method of manufacturing the semiconductor device illustrated in FIG. 11.

Referring to FIG. 13A, an etch stopping layer may be formed on a third insulating interlayer 126, a storage node contact 128a and a second contact plug 128b. On the etch stopping layer, a first mold layer, a supporting layer and a second mold layer may be formed one by one.

The second mold layer, the supporting layer and the etch stopping layer may be partially etched one by one to form a first opening portion 139a and a second opening portion 139b in the cell region and the peripheral region, respectively. Through the etching process, an etch stopping layer pattern 130, a first mold layer pattern 132, a preliminary supporting layer pattern 134 and a second mold layer pattern 136 may be formed.

The second opening portions 139b may be formed so as to not face a portion for forming the second metal contact 152b. That is, the second opening portions 139b may not be formed around a portion for forming the second metal contact 152b although the second opening portions 139b may be arranged regularly.

The first opening portions 139a may be formed so as to be arranged regularly.

Figure 13B:
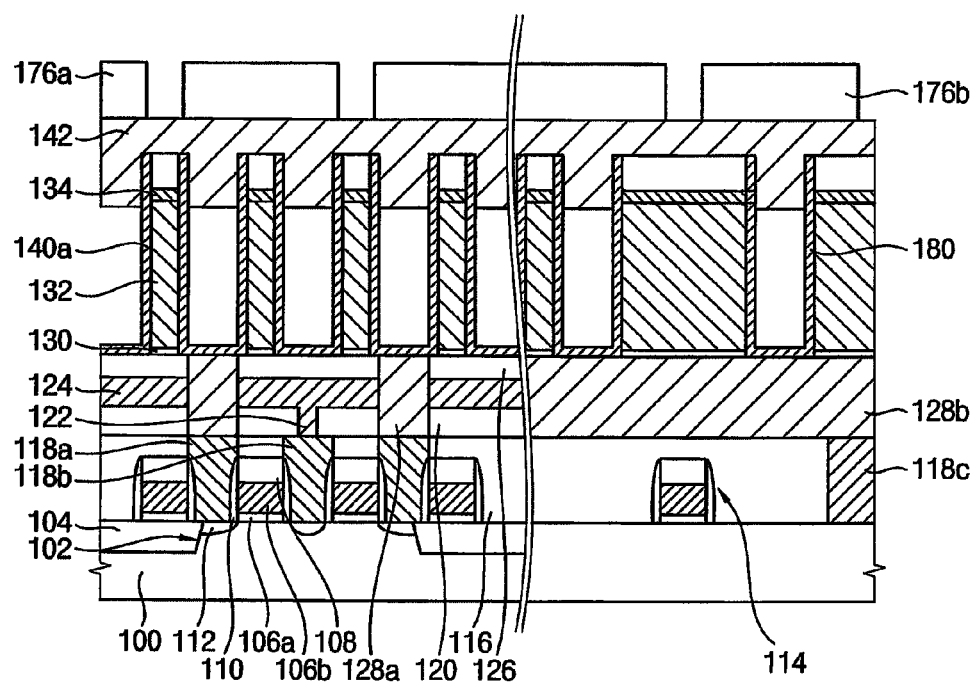

Referring to FIG. 13B, a conductive layer (not illustrated) may be uniformly formed on sidewall and bottom portions of the first and second opening portions 139a and 139b and along an upper surface of the second mold layer pattern 136. On the conductive layer, a sacrificial layer (not illustrated) sufficiently filling up inner portions of the first and second opening portions 139a and 139b may be formed. The sacrificial layer and the conductive layer may be removed to expose upper portion of the second mold layer pattern 136 and to form first and second lower electrodes 140a and 180 having a cylinder shape. The second lower electrode 180 may not be formed at a portion facing the second metal contact 152b in the peripheral region.

A capping layer 142 covering upper portions of the first and second lower electrodes 140a and 180 and the second mold layer pattern 136 may be formed. The capping layer 142 may be formed on the remaining sacrificial layer in the first and second lower electrodes 140a and 180.

A photoresist layer may be coated on the capping layer 142 and exposed and developed to form first and second etching mask patterns 176a and 176b in the cell region and peripheral region, respectively. The first and second etching mask patterns 176a and 176b may selectively cover portions where first and second supporting layer patterns may be formed. Particularly, the first etching mask pattern 176a may have a shape including a first hole. The second etching mask pattern 176b may include a shape including a second hole exposing a portion where the second lower electrode 180 may not be formed.

Figure 13C:
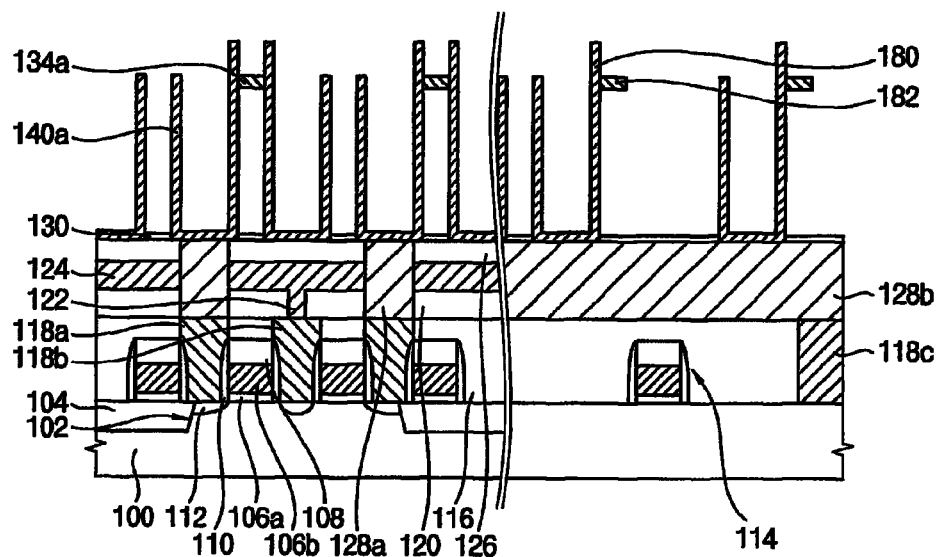

Referring to FIG. 13C, the capping layer 142 and a preliminary supporting layer pattern 134 may be etched using the first and second etching mask patterns 176a and 176b. First and second supporting layer patterns 134a and 182 having the shape as illustrated in FIG. 12 may be formed.

The capping layer 142 and the first and second mold layer patterns 132 and 136 may be removed. The surface portion of the cylinder of the first and second lower electrodes 140a and 180 may be exposed.

Figure 13D:
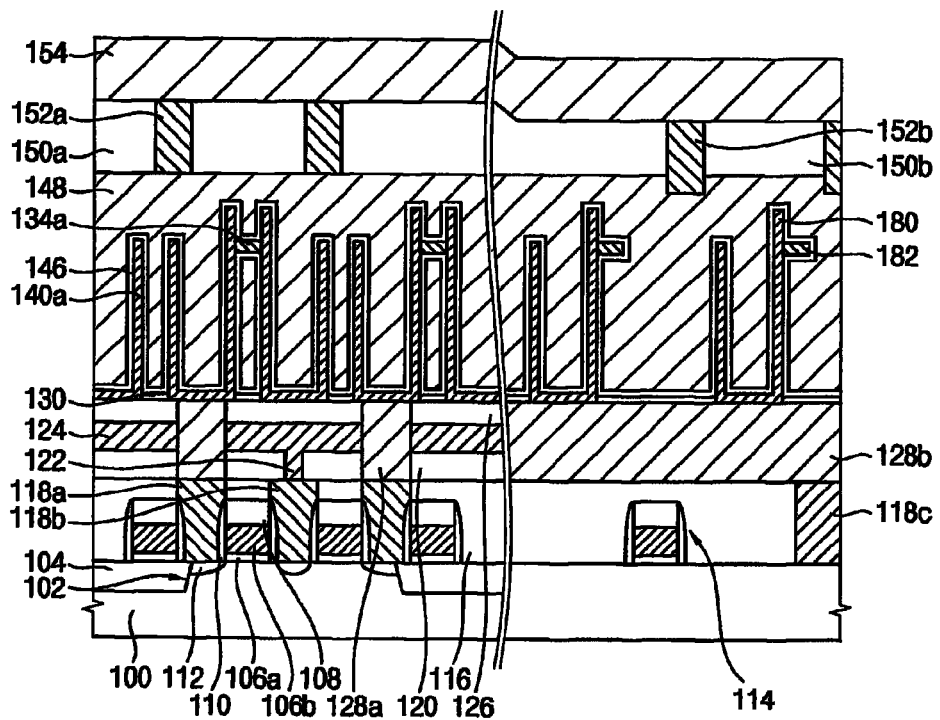

Referring to FIG. 13D, a dielectric layer 146 and an upper electrode 148 may be formed on surface portions of the first and second lower electrodes 140a and 180 and along the etch stopping layer pattern 130. Through performing the processes, a cell capacitor may be formed in the cell region and a capacitor for a relatively low voltage may be formed in the peripheral region.

An insulating layer may be formed on the upper electrode 148 and then polished to form first and second inter-metal dielectric layers 150a and 150b in the cell region and the peripheral region, respectively. The second inter-metal dielectric layer 150b in the peripheral region may have a smaller height than the first inter-metal dielectric layer 150a in the cell region. A first metal contact 152a and a second metal contact 152b making a contact with the upper electrode 148 may be formed through the first and second inter-metal dielectric layers 150a and 150b, respectively. The second metal contact 152b may be formed at a portion not including the second lower electrode 180. A generation of a bridge defect between the second lower electrode 180 and the second metal contact 152b in the peripheral region may be restrained.

EXAMPLE EMBODIMENT 5

Figure 14:
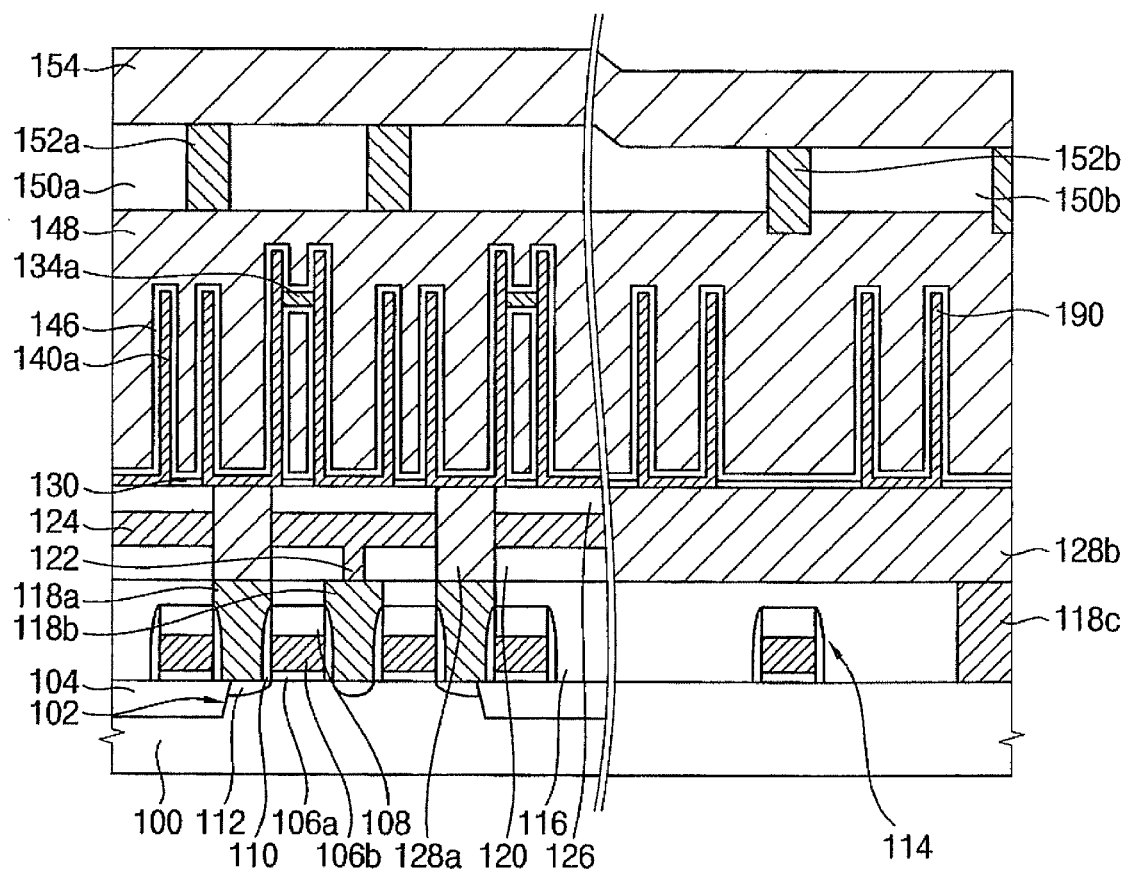
Figure 15:
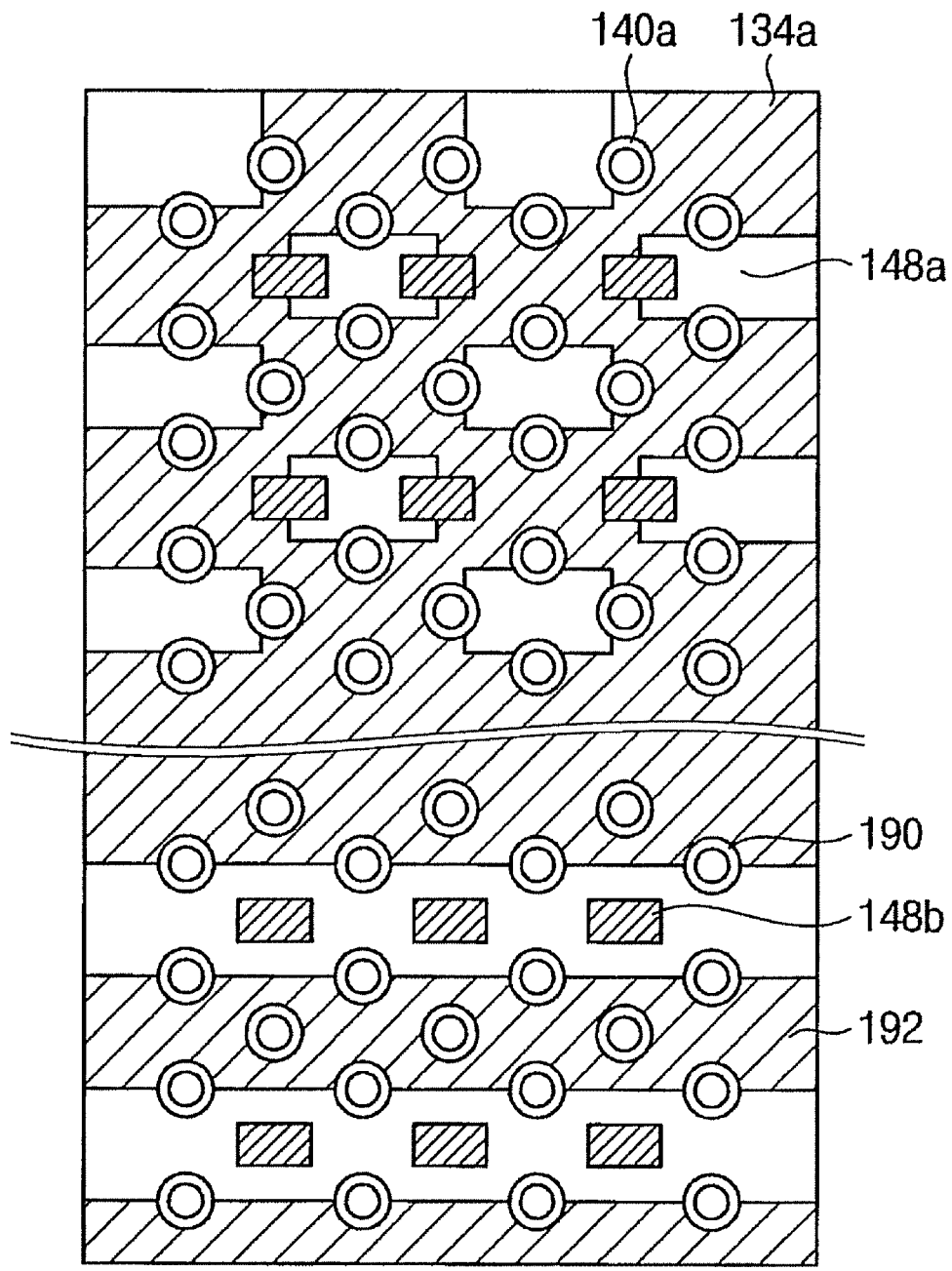

FIG. 14 is a cross-sectional view for explaining a semiconductor device in accordance with another example embodiment. FIG. 15 is a plan view of the semiconductor device illustrated in FIG. 14.

The structure of the semiconductor device under the capacitor may be the same as the structure illustrated in Example Embodiment 1. Explanation on the same elements for the semiconductor device as in Example Embodiment 1 will be omitted or will be given briefly hereinafter.

Referring to FIGS. 14 and 15, a cell capacitor may include a first lower electrode 140a having a cylinder shape, a dielectric layer 146, and an upper electrode 148. A capacitor for a relatively low voltage may include a second lower electrode 190 having a cylinder shape, a dielectric layer 146, and an upper electrode 148.

The second lower electrode 190 may not be provided at a portion for forming a second metal contact 152b and a portion facing the second metal contact 152b. Although the second lower electrodes 190 may be formed to have a regular arrangement, the second lower electrodes 190 may not be formed at a portion for forming the second metal contact 152b and a portion facing the second metal contact 152b.

The first supporting layer pattern 134a included in the cell capacitor may have one pattern shape including first holes having a contact shape surrounding a portion of upper sidewall portions of the regularly arranged first lower electrodes 140a. The first lower electrodes 140a around the first holes may have a relatively small height.

A second supporting layer pattern 192 included in the capacitor for the relatively low voltage may have a line shape at both side portions of a portion not including the second lower electrode 190. The second supporting layer patterns 192 may support the second lower electrodes 190. Between the second supporting layer patterns 192, a gap having a line shape may be provided. The second metal contacts 152b may be provided around the gap so as to face the gap. Since the second supporting layer patterns 192 may not be formed at a portion not including the second lower electrodes 190, the gap may be positioned at a portion including the second lower electrodes 190.

On the upper electrode 148 in the cell region and the peripheral region, first and second inter-metal dielectric layers 150a and 150b may be provided. The second inter-metal dielectric layer 150b in the peripheral region may have a smaller height than the first inter-metal dielectric layer 150a in the cell region.

In the cell region, a first metal contact 152a contacting the upper electrode 148 may be formed. The first metal contacts 152a may be arranged in regular patterns and the positions thereof may be unlimited. Particularly, the first metal contacts 152a may be positioned so as to face the first lower electrodes 140a.

In the peripheral region, second metal contacts 152b making a contact with the upper electrode 148 may be formed. The second metal contacts 152b may be arranged in regular patterns so as to face a portion excluding the second lower electrodes 190. In addition, the second metal contacts 152b may face the gap portion. Since the second lower electrodes may not be provided under the second metal contacts 152b, a generation of a bridge defect through a contact between the second metal contact 152b and the second lower electrode 190 may be restrained. Further, a generation of a leakage current may be reduced or prevented.

FIGS. 16A to 16D are cross-sectional views for explaining a method of manufacturing the semiconductor device illustrated in FIG. 15.

The same structure illustrated in FIG. 5B may be fainted by performing the same processes explained referring to FIGS. 5A and 5B.

Figure 16A:
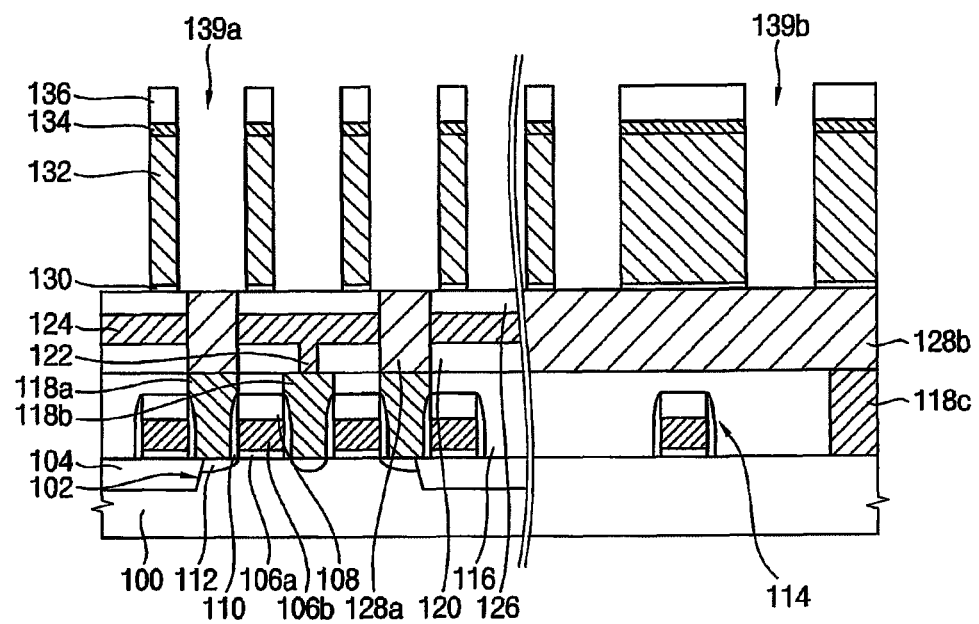
FIGS. 16A to 16D are cross-sectional views for explaining a method of manufacturing the semiconductor device illustrated in FIG. 14.

Referring to FIG. 16A, an etch stopping layer may be formed on a third insulating interlayer 126, a storage node contact 128a and a second contact plug 128b. On the etch stopping layer, a first mold layer, a supporting layer, and a second mold layer may be formed one by one.

The second mold layer, the supporting layer, the first mold layer, and the etch stopping layer may be partially etched one by one to form a first opening portion 139a in the cell region and a second opening portion 139b in the peripheral region. Through the etching process, an etch stopping layer pattern 130, a first mold layer pattern 132, a preliminary supporting layer pattern 134, and a second mold layer pattern 136 may be formed.

In this case, the second opening portion 139b may not be formed at a portion facing a portion including the second metal contact 152b. That is, although the second opening portions 139b may be arranged in regular patterns, the second opening portions 139b may not be formed at a portion including the second metal contact 152b.

The first opening portions 139a may be formed so as to be arranged in regular patterns.

Figure 16B:
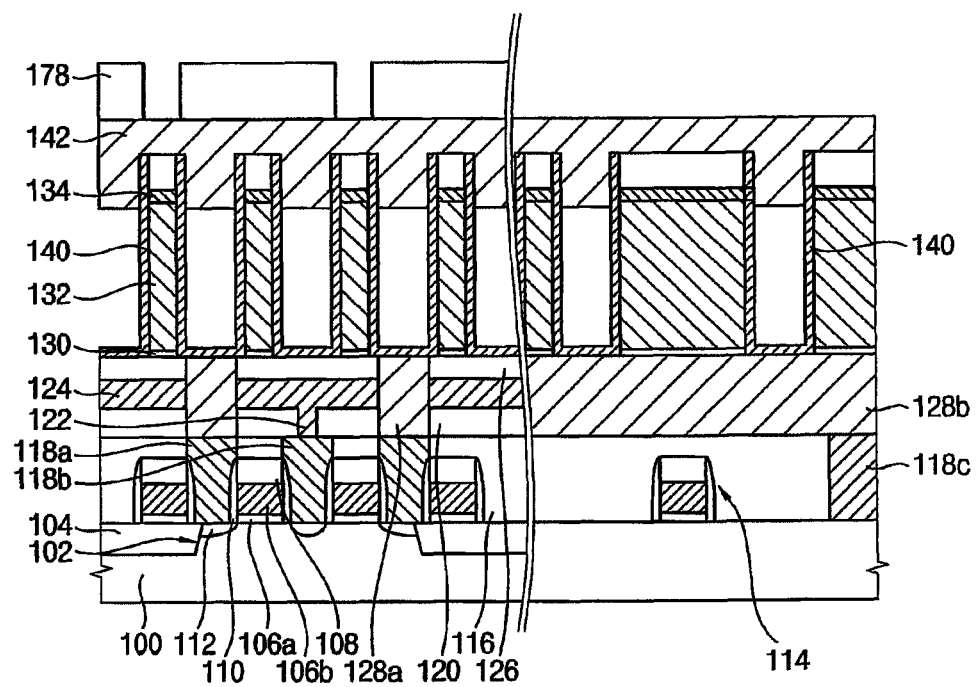

Referring to FIG. 16B, a conductive layer (not illustrated) may be uniformly formed along sidewall portions and bottom portions of the first and second opening portions 139a and 139b and along an upper surface portion of the second mold layer pattern 136. On the conductive layer, a sacrificial layer (not illustrated) sufficiently filling up the inner portion of the opening portion may be formed. The sacrificial layer and the conductive layer may be removed to expose an upper surface of the second mold layer pattern 136 and to form first and second lower electrodes 140a and 190 having a cylinder shape. The second lower electrodes 190 may not be formed at a portion facing the second metal contact 152b in the peripheral region.

A capping layer 142 covering upper portions of the first and second lower electrodes 140a and 190 having a cylinder shape and the second mold layer pattern 136 may be aimed. The capping layer 142 may be formed on the sacrificial layer remaining in the first and second lower electrodes 140a and 180.

A photoresist layer may be coated on the capping layer and then exposed and developed to form an etching mask pattern 178 in the cell and peripheral regions. The etching mask pattern 178 may selectively cover a portion where first and second supporting layer patterns may be formed. Particularly, the etching mask pattern 178 in the cell region may have a shape including first holes. The etching mask pattern 178 in the peripheral region may have a line shape exposing a portion not including the second lower electrodes 190.

Figure 16C:
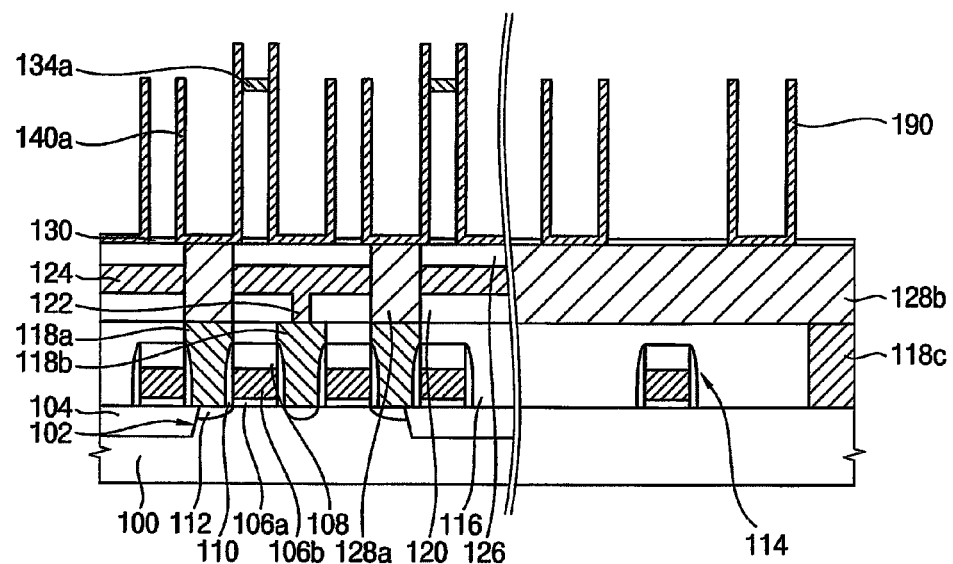

Referring to FIG. 16C, the capping layer 142 and the preliminary supporting layer pattern 134 may be etched using the etching mask pattern 178. The first and second supporting layer patterns 134a and 192 having a shape illustrated in FIG. 15 may be formed.

The capping layer 142 and the first and second mold layer patterns 132 and 136 may be removed. Through the above described processes, surface portions of the cylinder of the first and second lower electrodes 140a and 190 may be exposed.

The second lower electrode 190 and the second supporting layer pattern 192 may not be provided at a portion facing the second metal contact 152b in the peripheral region.

Figure 16D:
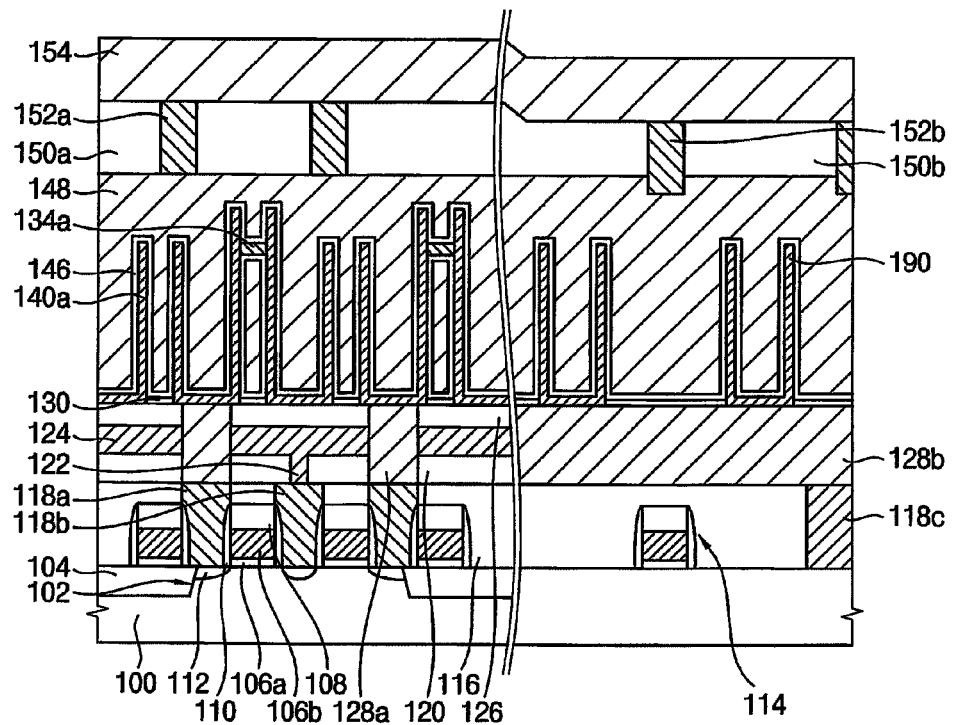

Referring to FIG. 16D, a dielectric layer 146 and an upper electrode 148 may be formed on surface portions of the first and second lower electrodes 140a and 190 and along the etch stopping layer pattern 130. A cell capacitor may be formed in the cell region and a capacitor for a relatively low voltage may be formed in the peripheral region.

An insulating layer may be formed on the upper electrode 148 and then polished to form first and second inter-metal dielectric layers 150a and 150b in the cell region and the peripheral region, respectively. The second inter-metal dielectric layer 150b in the peripheral region may have a smaller height than the first inter-metal dielectric layer 150a in the cell region. Through the first and second inter-metal dielectric layers 150a and 150b, a first metal contact 152a and a second metal contact 152b making a contact with the upper electrode 148 may be formed, respectively. The second metal contact 152b may be formed at a portion not including the second lower electrode 190. A generation of a bridge defect between the second lower electrode 190 and the second metal contact 152b in the peripheral region may be restrained.

Figure 17:
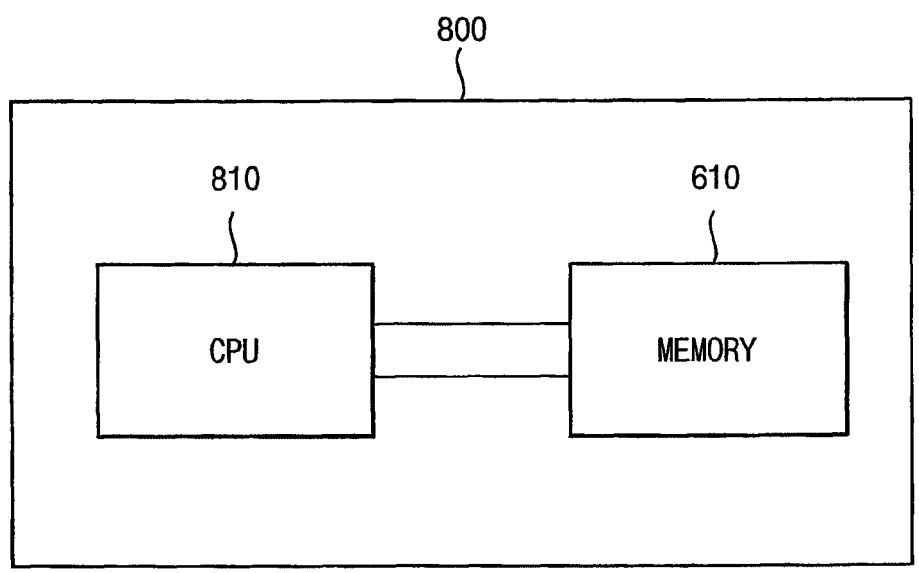

FIG. 17 is a system including a semiconductor device manufactured by a method in accordance with an example embodiment.

Referring to FIG. 17, a memory 610 may include a DRAM device manufactured by example embodiments described above. The memory 610 may be connected to a central processing unit (CPU) 810 in a computer system 800 as illustrated in FIG. 17.

Particularly, the computer system 800 may be a personal computer, a personal data assistant, or other similar systems. The memory 610 may be connected to the CPU 810 via a bus.

Figure 18:
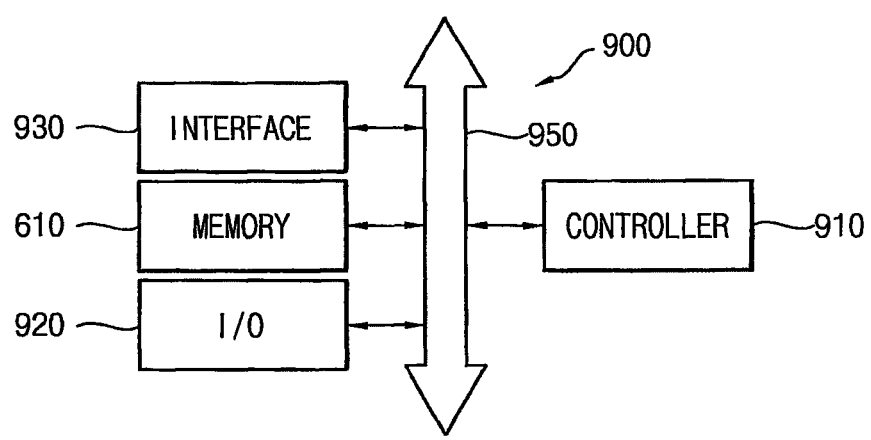

FIG. 18 is a device including a semiconductor device manufactured by a method in accordance with another example embodiment.

Referring to FIG. 18, a device 900 may include a controller 910, an input/output device 920 including a key board, a display, etc., a memory 610 and an interface 930 in accordance with example embodiments. Each element in the device 900 may be connected to each other via a bus 950. The controller 910 may include one or more of a micro processor, a digital processor, a micro controller, and a processor. The memory 610 may store data and/or orders executed by the controller 910. The interface 930 may be used to transfer data from a telecommunicating network or to the telecommunicating network. The device 900 may be a mobile system, a portable computer, a web tablet, a wireless phone, a mobile phone, a digital music player, a memory card, or other system capable of sending and/or receiving information.

As described above, a generation of a bridge defect between a lower electrode and a metal contact may be restrained and a generation of a leakage current may be reduced or prevented. A DRAM device having a higher integration and a higher performance may be manufactured.

Although a few example embodiments have been described herein, those skilled in the art will readily appreciate that many modifications are possible without materially departing from the novel teachings and advantages of the present inventive concepts. Accordingly, all such modifications are intended to be included within the scope of the present inventive concepts as defined in the claims. In the claims, means-plus-function clauses (if applicable) are intended to cover the structures described herein as performing the recited function and not only structural equivalents but also equivalent structures. Therefore, it is to be understood that the foregoing is merely illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, the method comprising:

forming preliminary lower electrodes and a supporting layer supporting upper sidewalls of the preliminary lower electrodes;

partially etching the supporting layer and an upper portion of the preliminary lower electrodes to form a supporting layer pattern and lower electrodes, each of the lower electrodes having a taller side with a height that is greater than an opposing shorter side, the supporting layer pattern contacting the taller sides of the lower electrodes;

forming a dielectric layer on the lower electrodes and the supporting layer pattern;

forming an upper electrode on the dielectric layer;

forming an inter-metal dielectric layer on the upper electrode; and forming a metal contact penetrating the inter-metal dielectric layer and contacting the upper electrode, a bottom portion of the metal contact being aligned above the shorter sides of the lower electrodes.

2. The method of claim 1, further comprising:

forming a conductive line on the substrate, the conductive line contacting a bottom portion of the lower electrodes.

3. The method of claim 1, wherein the partially etching includes removing portions of the supporting layer and the preliminary lower electrodes that would be aligned below the bottom portion of the metal contact.

4. The method of claim 1, wherein the forming a metal contact includes aligning the metal contact with an inner portion of a gap between adjacent supporting layer patterns.

5. The method of claim 1, wherein the forming preliminary lower electrodes and a supporting layer comprises:

forming a first mold layer, the supporting layer, and a second mold layer on the substrate;

partially etching the second mold layer, the supporting layer, and the first mold layer to form opening portions; and forming the lower electrodes in the opening portions.

6. The method of claim 5, further comprising:

forming a capping layer in the opening portions including the lower electrodes and on the second mold layer.

7. The method of claim 6, further comprising:

removing the capping layer, the first mold layer, and the second mold layer after forming the supporting layer pattern.

8. The method of claim 1, wherein the partially etching includes forming the supporting layer pattern to have a pattern shape or a line shape, the pattern shape including a hole.

9. The method of claim 1, wherein the partially etching, the forming a dielectric layer, and the forming an upper electrode include forming the lower electrodes, the dielectric layer, the upper electrode, and the supporting layer pattern in a peripheral region of the substrate, the lower electrodes, the dielectric layer, and the upper electrode constituting at least one capacitor.

* * * * *